US009768012B2

(12) United States Patent
Yamazaki et al.

(10) Patent No.: US 9,768,012 B2
(45) Date of Patent: Sep. 19, 2017

(54) METHOD FOR PROCESSING SUBSTRATE AND SUBSTRATE PROCESSING APPARATUS

(71) Applicant: HITACHI KOKUSAI ELECTRIC INC., Tokyo (JP)

(72) Inventors: Hirohisa Yamazaki, Toyama (JP); Yuji Takebayashi, Toyama (JP); Masanori Sakai, Takaokashi (JP); Tsutomu Kato, Takaokashi (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/711,551

(22) Filed: May 13, 2015

(65) Prior Publication Data

US 2015/0243493 A1    Aug. 27, 2015

Related U.S. Application Data

(62) Division of application No. 13/313,736, filed on Dec. 7, 2011, now abandoned, and a division of application
(Continued)

(30) Foreign Application Priority Data

Jun. 20, 2008  (JP) ................................. 2008-162106
May 11, 2009  (JP) ................................. 2009-114862

(51) Int. Cl.
*H01L 21/02*  (2006.01)
*C23C 16/40*  (2006.01)
(Continued)

(52) U.S. Cl.
CPC ........ *H01L 21/0228* (2013.01); *C23C 16/405* (2013.01); *C23C 16/4412* (2013.01);
(Continued)

(58) Field of Classification Search
CPC ........... H01L 21/0228; H01L 21/02205; H01L 21/02112; C23C 16/4412; C23C 16/45557; C23C 16/45527; C23C 16/405
See application file for complete search history.

(56) References Cited

U.S. PATENT DOCUMENTS 4,877,588 A * 10/1989 Ditzler .................... C01B 13/11
                                                        422/186.07
4,882,129 A * 11/1989 Andrews ................. C01B 13/11
                                                        422/186.07
(Continued)

FOREIGN PATENT DOCUMENTS

JP          06-045256 A       2/1994
JP          09-082696 A       3/1997
(Continued)

OTHER PUBLICATIONS

Apr. 17, 2013 Office Action issued in U.S. Appl. No. 12/457,779.
(Continued)

*Primary Examiner* — Jeffrie R Lund
(74) *Attorney, Agent, or Firm* — Oliff PLC

(57) ABSTRACT

There is provided a substrate processing method, comprising the steps of: supplying source gas into a processing chamber in which substrates are accommodated; removing the source gas and an intermediate body of the source gas remained in the processing chamber; supplying ozone into the processing chamber in a state of substantially stopping exhaust of an atmosphere in the processing chamber; and removing the ozone and the intermediate body of the ozone remained in the processing chamber; with these steps repeated multiple number of times, to thereby form an oxide film on the surface of the substrates by supplying the source gas and the ozone alternately so as not to be mixed with each other.

19 Claims, 15 Drawing Sheets

Related U.S. Application Data

No. 12/457,779, filed on Jun. 22, 2009, now abandoned.

(51) Int. Cl.
    *C23C 16/44*     (2006.01)
    *C23C 16/455*     (2006.01)

(52) U.S. Cl.
    CPC .. *C23C 16/45527* (2013.01); *C23C 16/45557* (2013.01); *H01L 21/02112* (2013.01); *H01L 21/02205* (2013.01)

(56) References Cited

U.S. PATENT DOCUMENTS

| | | | |
|---|---|---|---|
| 5,316,639 A | | 5/1994 | Okazaki et al. |
| 5,332,555 A | | 7/1994 | Hosokawa et al. |
| 5,693,578 A | * | 12/1997 | Nakanishi ......... H01L 21/02046 |
| | | | 257/E21.226 |
| 5,746,841 A | | 5/1998 | Koike et al. |
| 5,789,086 A | | 8/1998 | Ohmi |
| 5,810,978 A | | 9/1998 | Nakatsuka et al. |
| 6,116,092 A | | 9/2000 | Ohmi et al. |
| 6,863,725 B2 | * | 3/2005 | Vaartstra ............... C23C 16/405 |
| | | | 117/84 |
| 6,905,549 B2 | | 6/2005 | Okuda et al. |
| 7,662,727 B2 | | 2/2010 | Miya et al. |
| 7,767,594 B2 | * | 8/2010 | Miya ..................... C23C 16/402 |
| | | | 257/E21.24 |
| 7,779,785 B2 | | 8/2010 | Miya et al. |
| 8,003,547 B2 | | 8/2011 | Sakai |
| 8,039,404 B2 | | 10/2011 | Miya et al. |
| 8,105,957 B2 | | 1/2012 | Miya et al. |
| 8,227,346 B2 | | 7/2012 | Miya et al. |
| 8,337,710 B2 | | 12/2012 | Takeuchi et al. |
| 8,460,435 B2 | * | 6/2013 | Tabata .................. B01D 53/04 |
| | | | 422/186.08 |
| 8,539,908 B2 | | 9/2013 | Takagi .............. C23C 16/45521 |
| | | | 118/695 |
| 2002/0173166 A1 | | 11/2002 | Christenson et al. |
| 2003/0015764 A1 | * | 1/2003 | Raaijmakers ..... H01L 21/02145 |
| | | | 257/424 |
| 2003/0180458 A1 | * | 9/2003 | Sneh ..................... C23C 16/4412 |
| | | | 427/248.1 |
| 2003/0207540 A1 | * | 11/2003 | Ahn .................. H01L 21/02178 |
| | | | 438/287 |
| 2005/0084428 A1 | | 4/2005 | Tokutake et al. |
| 2005/0088634 A1 | * | 4/2005 | Kosugi ............... G03F 7/70716 |
| | | | 355/30 |
| 2005/0191864 A1 | | 9/2005 | Nishiguchi et al. |
| 2006/0032442 A1 | * | 2/2006 | Hasebe ................. C03C 17/245 |
| | | | 118/715 |
| 2006/0213441 A1 | * | 9/2006 | Kobrin ..................... B05D 1/60 |
| | | | 118/715 |
| 2006/0258078 A1 | * | 11/2006 | Lee ....................... C23C 16/405 |
| | | | 438/216 |
| 2006/0258174 A1 | | 11/2006 | Sakai et al. |
| 2007/0134415 A1 | * | 6/2007 | Hwang ............. H01L 21/31654 |
| | | | 427/248.1 |
| 2008/0050884 A1 | | 2/2008 | Koyanagi et al. |
| 2008/0081104 A1 | | 4/2008 | Hasebe et al. |
| 2008/0124945 A1 | | 5/2008 | Miya et al. |
| 2008/0132084 A1 | | 6/2008 | Miya et al. |
| 2008/0166886 A1 | | 7/2008 | Sakai et al. |
| 2008/0194088 A1 | * | 8/2008 | Srinivasan ............ C23C 16/405 |
| | | | 438/584 |
| 2009/0010835 A1 | * | 1/2009 | Ifland ..................... C01B 13/11 |
| | | | 423/581 |
| 2009/0035951 A1 | | 2/2009 | Miya et al. |
| 2009/0071505 A1 | | 3/2009 | Miya et al. |
| 2009/0075490 A1 | * | 3/2009 | Dussarrat .......... H01L 21/02164 |
| | | | 438/787 |
| 2009/0130860 A1 | | 5/2009 | Miya et al. |
| 2009/0186467 A1 | | 7/2009 | Sakai et al. |
| 2009/0197424 A1 | | 8/2009 | Sakai et al. |
| 2009/0203227 A1 | * | 8/2009 | Hasebe ................. C23C 16/345 |
| | | | 438/787 |
| 2009/0209081 A1 | * | 8/2009 | Matero ................. C23C 16/401 |
| | | | 438/400 |
| 2009/0223448 A1 | | 9/2009 | Sakai et al. |
| 2009/0280652 A1 | | 11/2009 | Miya et al. |
| 2009/0325389 A1 | | 12/2009 | Takebayashi et al. |
| 2010/0009079 A1 | | 1/2010 | Yamazaki et al. |
| 2010/0035437 A1 | | 2/2010 | Yamazaki et al. |
| 2010/0087069 A1 | | 4/2010 | Miya et al. |
| 2010/0129548 A1 | * | 5/2010 | Sneh .................... C23C 16/4409 |
| | | | 427/248.1 |
| 2010/0147777 A1 | | 6/2010 | Takeuchi et al. |
| 2010/0162952 A1 | | 7/2010 | Yamazaki |
| 2010/0186774 A1 | | 7/2010 | Miya et al. |
| 2010/0233887 A1 | | 9/2010 | Miya et al. |
| 2010/0258903 A1 | * | 10/2010 | Srinivasan ............ C23C 16/404 |
| | | | 257/532 |
| 2011/0014359 A1 | * | 1/2011 | Hashim ................. C23C 16/405 |
| | | | 427/80 |
| 2011/0033956 A1 | | 2/2011 | Sakai |
| 2011/0223073 A1 | | 9/2011 | Takeuchi et al. |
| 2011/0271753 A1 | | 11/2011 | Sakai |
| 2011/0311725 A1 | * | 12/2011 | Sneh ........................ C01B 21/16 |
| | | | 427/250 |
| 2012/0034788 A1 | | 2/2012 | Sakai et al. |
| 2012/0034790 A9 | | 2/2012 | Miya et al. |
| 2012/0077350 A1 | | 3/2012 | Miya et al. |
| 2012/0079985 A1 | | 4/2012 | Yamazaki et al. |
| 2015/0243493 A1 | * | 8/2015 | Yamazaki ............. C23C 16/405 |
| | | | 438/778 |
| 2015/0259796 A1 | * | 9/2015 | Suzuki ................... C23C 16/30 |
| | | | 427/255.38 |
| 2015/0354060 A1 | * | 12/2015 | Yabe .................. C23C 16/45544 |
| | | | 216/62 |

FOREIGN PATENT DOCUMENTS

| | | |
|---|---|---|
| JP | H-09-077593 | 3/1997 |
| JP | 09-196298 A | 7/1997 |
| JP | 2004-063902 A | 2/2004 |
| JP | 2004-131779 A | 4/2004 |
| JP | 2005-064305 A | 3/2005 |
| JP | 2005-064538 A | 3/2005 |
| JP | 2007-103966 A | 4/2007 |
| JP | 2008-053326 A | 3/2008 |
| JP | 2010-028095 A | 2/2010 |
| KR | 10-2008-0029846 | 4/2008 |
| WO | 2007-037233 A1 | 4/2007 |

OTHER PUBLICATIONS

Oct. 2, 2012 Notification of Reasons for Refusal issued in Japanese Patent Application No. 2009-114862 (with translation).

May 6, 2011 Office Action issued in Korean Patent Application No. 10-2011-0039314.

Translation of JP 09-196298 A.

\* cited by examiner

FIG. 5
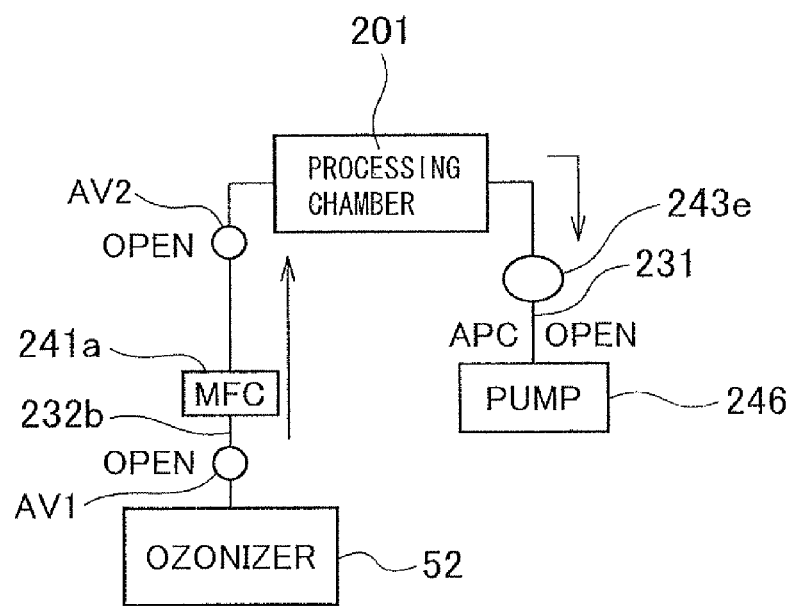
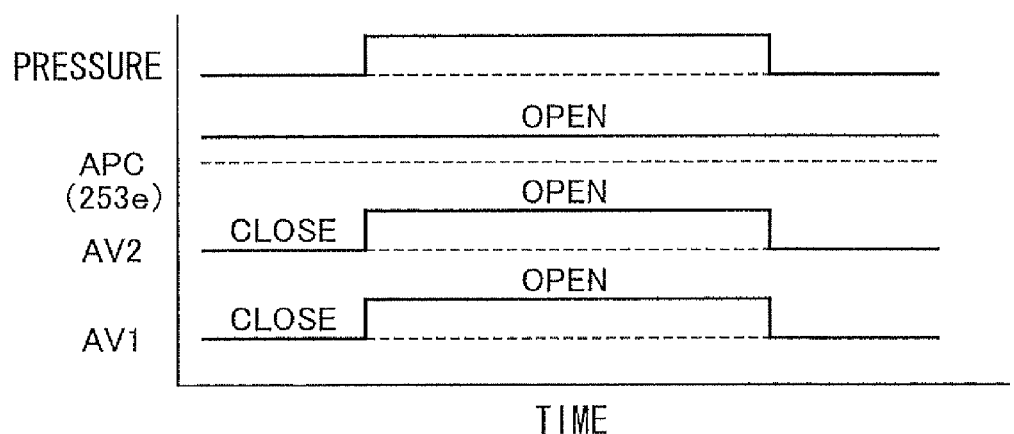
COMPARATIVE SEQUENCE

FIG. 6
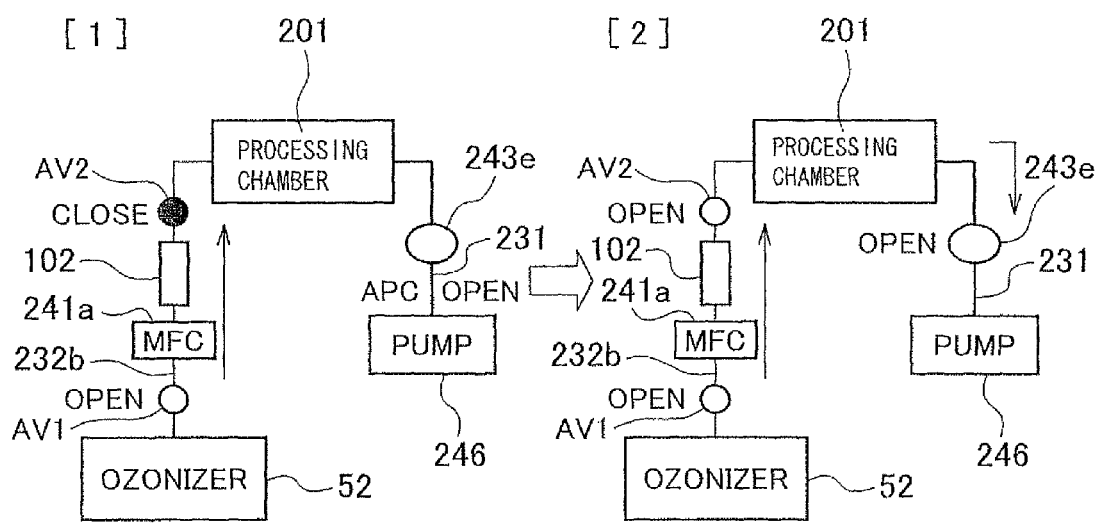
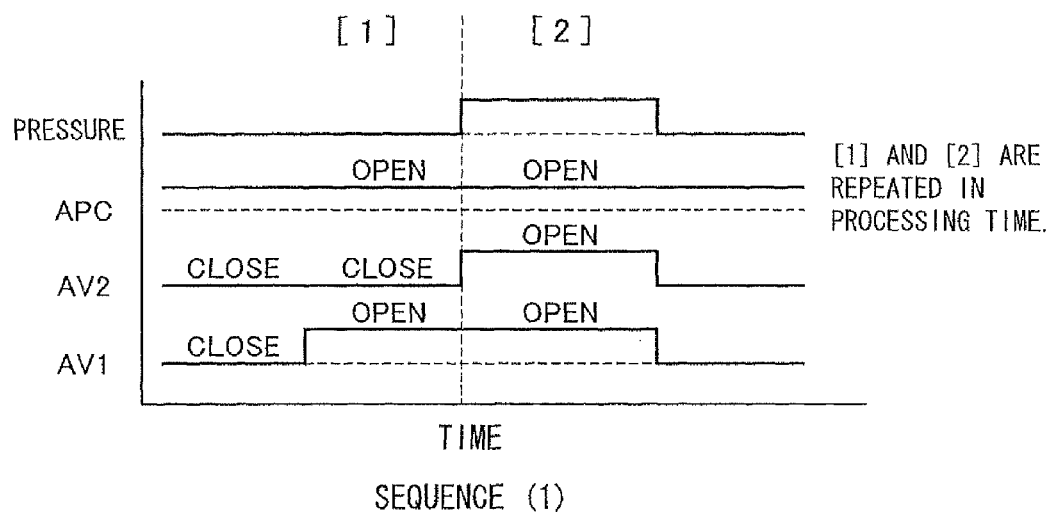
SEQUENCE (1)
[1] AND [2] ARE REPEATED IN PROCESSING TIME.

FIG. 7
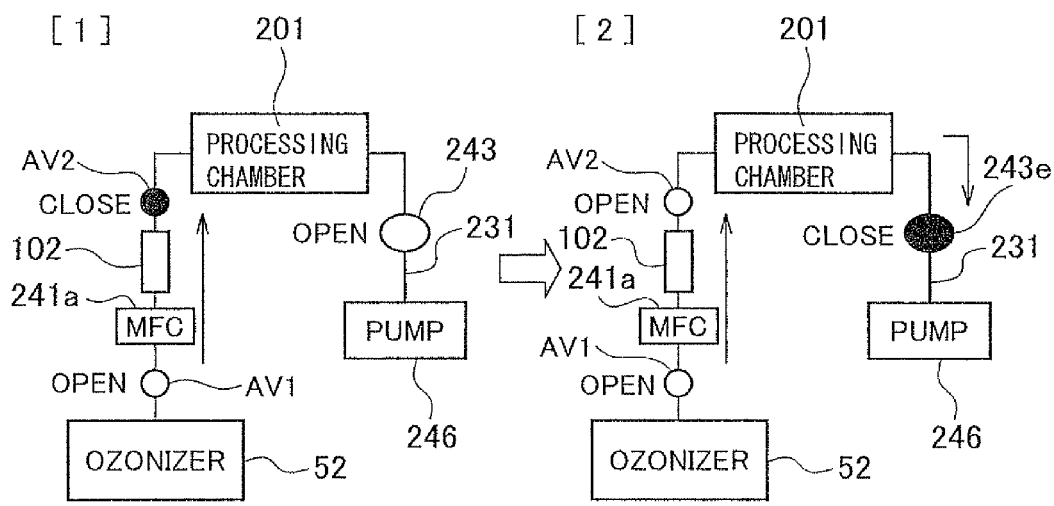
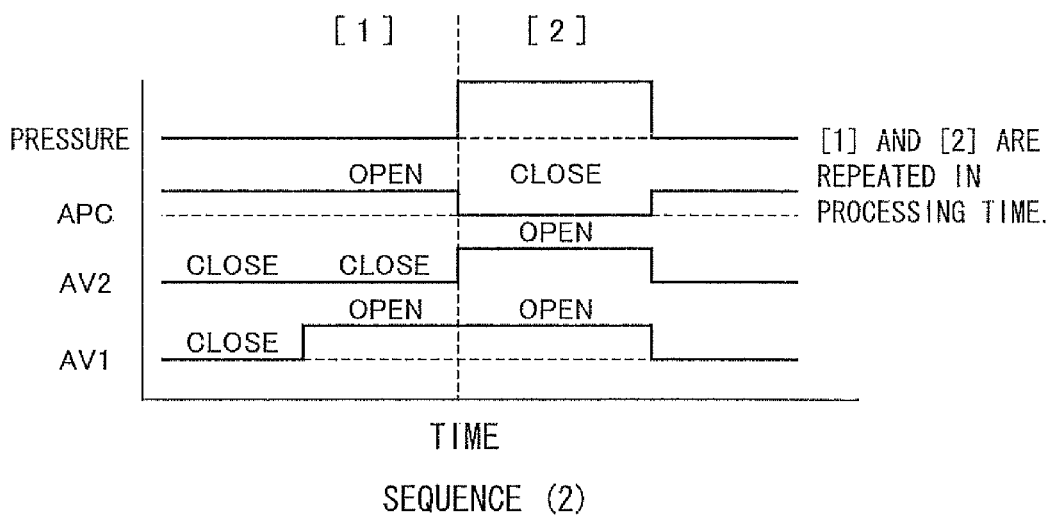
SEQUENCE (2)

FIG. 8
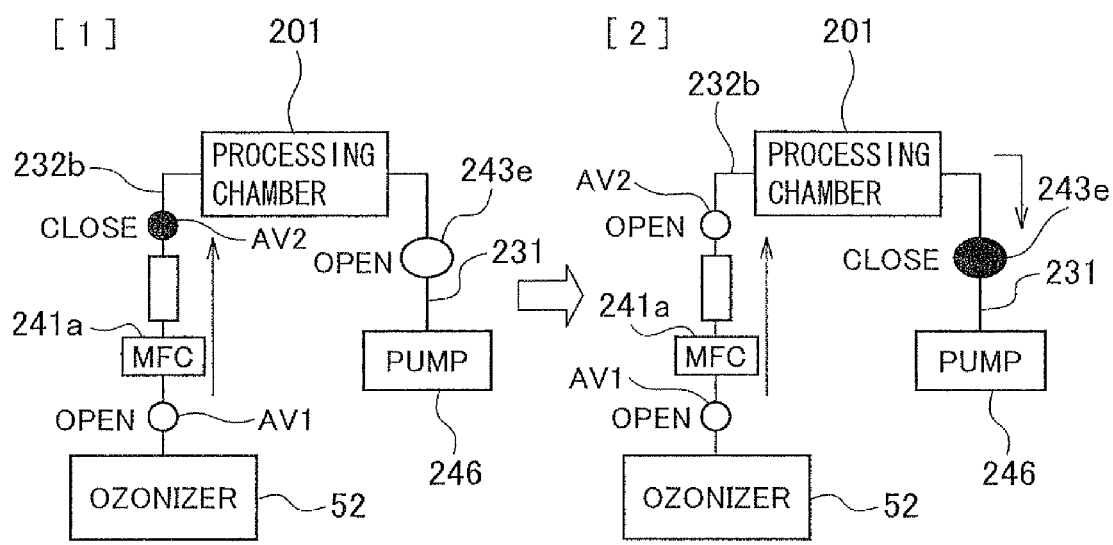
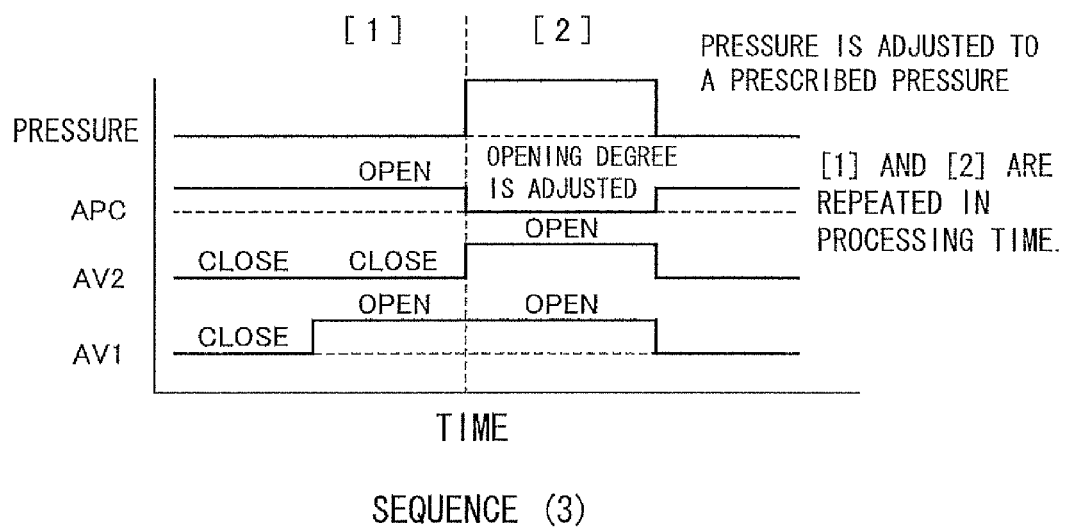
SEQUENCE (3)

RESULT IN PROCESSING BY USING ONLY $O_3$

| CONDITION | COMPARATIVE EXAMPLE 1 | EXAMPLE 1 (SEQUENCE EXAMPLE 1) | EXAMPLE 2 (SEQUENCE EXAMPLE 2) | EXAMPLE 3 (SEQUENCE EXAMPLE 3) |
|---|---|---|---|---|
| THICKNESS OF AVERAGE OXIDE FILM [Å] | 11.0 | 11.4 | 11.7 | 11.0 |
| THICKNESS OF SUBSTRATE CENTER PART [Å] | 10.5 | 11.4 | 11.9 | 11.0 |
| UNIFORMITY [±%] | 5.3 | 1.4 | 1.4 | 2.5 |

FIG. 11

RESULT OF UNIFORMITY OF FILM THICKNESS IN FROMING HfO2 FILM by ALD

| CONDITION | COMPRATIVE EXAMPLE 3 | | EXAMPLE 7 (SEQUENCE EXAMPLE 2) | | EXAMPLE 8 (SEQUENCE EXAMPLE 3) | |
|---|---|---|---|---|---|---|
| SUBSTRATE PROCESSING POSITION | BOAT UPPER PART | BOAT LOWER PART | BOAT UPPER PART | BOAT LOWER PART | BOAT UPPER PART | BOAT LOWER PART |
| AVERAGE THICKNESS OF OXIDE FILM [Å] | 78.8 | 74.1 | 72.6 | 72.1 | 72.8 | 76.0 |
| UNIFORMITY [±%] | 5.5 | 6.3 | 2.1 | 5.2 | 4.1 | 4.6 |

FIG. 12

(a) COMPARATIVE EXAMPLE 4

| | BOAT UPPER PART | BOAT MIDDLE PART | BOAT LOWER PART |
|---|---|---|---|
| UNIFORMITY OF COMPOSITION [±%] | 3.00 | 2.20 | 1.40 |

(b) EXAMPLE 9 (SEQUENCE EXAMPLE 2)

| | BOAT UPPER PART | BOAT MIDDLE PART | BOAT LOWER PART |
|---|---|---|---|
| UNIFORMITY OF COMPOSITION [±%] | 1.00 | 1.00 | 0.90 |

(c) EXAMPLE 10 (SEQUENCE EXAMPLE 3)

| | BOAT UPPER PART | BOAT MIDDLE PART | BOAT LOWER PART |
|---|---|---|---|
| UNIFORMITY OF COMPOSITION [±%] | 1.25 | 1.25 | 1.25 |

FIG. 14
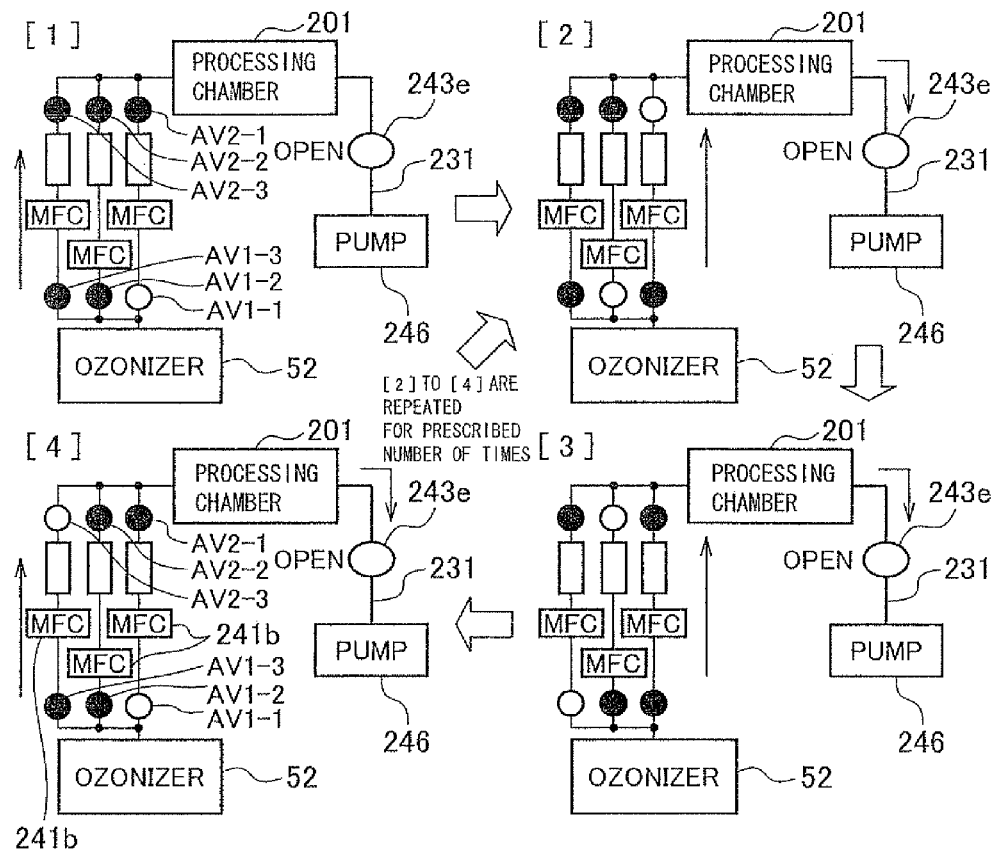
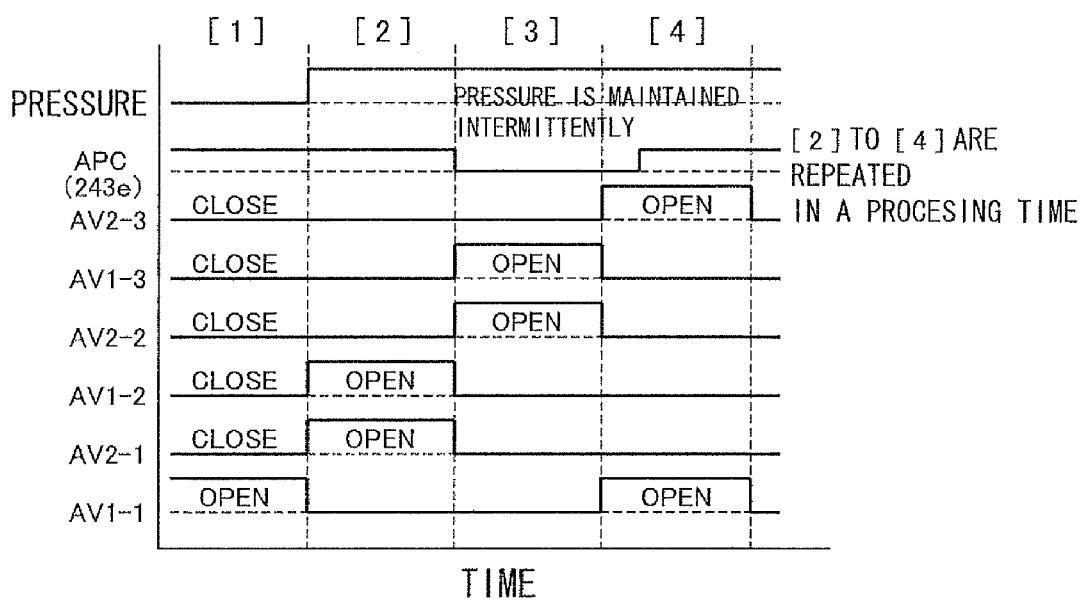

METHOD FOR PROCESSING SUBSTRATE AND SUBSTRATE PROCESSING APPARATUS

This application is a divisional of application Ser. No. 13/313,736 filed Dec. 7, 2011, which in turn is a divisional of application Ser. No. 12/457,779 filed Jun. 22, 2009, now abandoned. The entire disclosures of the prior applications are hereby incorporated by reference herein.

BACKGROUND

Technical Field

The present invention relates to a substrate processing method and a substrate processing apparatus.

Description of Related Art

As one of the manufacturing steps of a semiconductor device such as IC, a substrate processing step using an ALD (Atomic Layer Deposition) method and a CVD (Chemical Vapor Deposition) method is performed. A vertical substrate processing apparatus is used as a substrate processing apparatus for performing the substrate processing step. The vertical substrate processing apparatus includes a reaction tube for forming a processing chamber; a gas supply unit for supplying processing gas into the processing chamber; an exhaust unit for exhausting inside of the processing chamber; and a heater unit for heating the inside of the processing chamber. The vertical substrate processing apparatus is capable of processing a plurality of substrates by a single batch processing, and therefore has a characteristic that throughput (productivity) is higher than a sheet-type substrate processing apparatus.

FIG. 20 is a schematic view showing a structure of a processing furnace of a conventional vertical substrate processing apparatus. This processing furnace includes a reaction tube 203' made of, for example, quartz ($SiO_2$). A processing chamber 201' is formed in the reaction tube 203'. Boats (not shown) as substrate holding tools for supporting a plurality of wafers as substrates, are loaded into the processing chamber 201' in multiple stages. The processing furnace includes a gas supply unit for supplying processing gas such as source gas and oxide gas into the processing chamber 201'. The gas supply unit includes a first gas supply tube 232a' for supplying the source gas (such as a gas containing element Zr); a second gas supply tube 232b' for supplying the oxide gas (such as an ozone ($O_3$) gas); a first gas supply nozzle 233a' connected to the first gas supply tube 232a'; and a second gas supply nozzle 233b' connected to the second gas supply tube 232b'. The first gas supply nozzle 233a' and the second gas supply nozzle 233b' are respectively provided in the reaction tube 203', so as to be vertically extended from a lower part of the reaction tube 203' to a ceiling part of the reaction tube 203' along an inner wall of the reaction tube 203'. A plurality of gas jet holes are respectively provided in the first gas supply nozzle 233a' and the second gas supply nozzle 233b'. An arrangement pitch of the gas jet holes is made to be same as a support pitch of the plurality of wafers (not shown) supported by the aforementioned boats (not shown) in multiple stages. The gas jet holes are constituted so that the processing gas can be flown along an upper surface of each wafer. The first gas supply tube 232a' is connected to a source gas supply source for supplying source gas, through a valve 243a'. The second gas supply tube 232b' is connected to an oxide gas supply source for supplying oxide gas through a valve AV2'. Note that although not shown, the processing furnace further includes a carrier gas line for supplying $N_2$ gas, being a carrier gas (purge gas), into the processing chamber 201', and an exhaust unit for exhausting an atmosphere in the processing chamber 201'.

For example, in the substrate processing step using the ALD method, first source gas supplying step→$N_2$ purging step→first exhausting step→second source gas supplying step→$N_2$ purging step→second exhausting step are set as one cycle, and this cycle is repeated multiple number of times. In the first source gas supplying step, the valve AV2' is closed and the valve 243a' is opened, while exhausting the inside of the processing chamber 201' by the exhaust unit (not shown), and the source gas is supplied into the processing chamber 201'. Thus, the source gas jetted from each gas jet hole of the first gas supply nozzle 233a' is flown horizontally on each wafer, then is adsorbed on the surface of the wafer, to thereby form a base film on the wafer. In the $N_2$ purging step, the valve AV2' and the valve 243a' are closed while continuing exhaust of the inside of the processing chamber 201' by the exhaust unit (not shown), and $N_2$ gas, being purge gas, is supplied into the processing chamber 201' from a carrier gas line (not shown). Thus, the source gas remained in the processing chamber 201' is discharged from the processing chamber 201', and the inside of the processing chamber 201' is purged. In the first exhausting step, supply of the $N_2$ gas from the carrier gas line (not shown) is stopped, with the valve AV2' and the valve 243a' closed, while continuing the exhaust of the inside of the processing chamber 201' by the exhaust unit (not shown). Thus, the inside of the processing chamber 201' is exhausted and cleaned. In the oxide gas supplying step, $O_3$ gas, being the oxide gas, is supplied into the processing chamber 201', with the valve 243a' closed and the valve AV2' opened, while continuing the exhaust of the inside of the processing chamber 201'. Thus, the oxide gas jetted from each gas jet hole of the second gas supply nozzle 233b' is flown horizontally on each wafer, which is then reacted with the base film formed on the wafer, to thereby form an oxide film on the wafer.

Thus, in the ALD method and the CVD method, oxide gas containing, for example, ozone, being oxide species, is used as a second source, so that ozone is horizontally supplied along an upper surface of each wafer. However, if processing is performed by a conventional vertical substrate processing apparatus, there is a tendency that oxidation is easily advanced on an outer peripheral side of the wafer to which ozone is supplied easily, and oxidation is delayed on a center side of the wafer to which ozone is hardly supplied. Therefore, a film thickness distribution and composition distribution in a surface of the wafer are deteriorated, thus generating variation in the characteristic of the semiconductor device, and a manufacturing yield of the semiconductor device is deteriorated in some cases.

Therefore, the following two methods have been examined. One of them is a method of preventing a delay in oxidation in the center part of the wafer, by increasing a flow speed of the oxide gas containing ozone on the wafer. The other one is a method of processing substrates uniformly in the surface, by eliminating an uneven oxidation over the whole wafer, by supplying to the wafer, a large flow rate of the oxide gas containing high density ozone.

However, in the former method, sufficient improvement is not observed, and it is difficult to sufficiently prevent the delay in oxidation in the center part of the wafer, and it is difficult to improve the manufacturing yield of the semiconductor device.

Further, in the latter method, the yield can be improved. However, a flow rate of high density ozone that can be supplied at once is reduced, in terms of a performance of ozonizer (not shown) of the oxide gas supply source, then supply time of ozone is prolonged, and throughput (productivity) is deteriorated.

An object of the present invention is to shorten a processing time and improve uniformity of a film thickness in the surface, when the oxide film is formed by supplying the oxide gas onto the substrate.

SUMMARY OF THE INVENTION

According to a first aspect of the present invention, there is provided a substrate processing method, including the steps of:

supplying source gas into a processing chamber in which substrates are accommodated;

removing the source gas and an intermediate body of the source gas remained in the processing chamber;

supplying ozone into the processing chamber, in a state of substantially stopping an atmosphere in the processing chamber;

removing the ozone and the intermediate body of the ozone remained in the processing chamber, with these steps repeated multiple number of times, and the source gas and the ozone alternately supplied so as not to be mixed with each other, to thereby form an oxide film on the surface of the substrates.

According to other aspect of the present invention, there is provided a substrate processing method, including the steps of:

supplying source gas into a processing chamber in which substrates are accommodated;

exhausting an atmosphere in the processing chamber;

reserving the ozone into a gas reservoir connected to the processing chamber;

supplying into the processing chamber the ozone reserved into the gas reservoir; and exhausting the atmosphere in the processing chamber, with these steps repeated multiple number of times, and the source gas and the ozone alternately supplied so as not to be mixed with each other, to thereby form an oxide film on the surface of the substrates.

According to further another aspect of the present invention, there is provided a substrate processing method, including the steps of:

loading substrates into a processing chamber;

supplying ozone into the processing chamber, in a state of substantially stopping exhaust of an atmosphere in the processing chamber; and removing the ozone and an intermediate body of the ozone remained in the processing chamber, with the step of supplying ozone and the step of removing the ozone repeated multiple number of times, to thereby form an oxide film on the surface of the substrates.

According to further another aspect of the present invention, there is provided a substrate processing method, including the steps of:

reserving ozone into a gas reservoir connected to a processing chamber in which substrates are accommodated;

supplying into the processing chamber the ozone reserved into the gas reservoir; and exhausting an atmosphere in the processing chamber, with these steps repeated multiple number of times, to thereby form an oxide film on the surface of the substrates.

According to further another aspect of the present invention, there is provided a substrate processing apparatus, including:

a processing chamber that processes substrates;

a gas supply unit that supplies ozone into the processing chamber;

an exhaust unit that exhausts an atmosphere in the processing chamber; and a controller, with the gas supply unit including an ozone supply path connected to the processing chamber, and an ozone supply valve that performs open/close of the ozone supply path, the exhaust unit including an exhaust path connected to the processing chamber, and an exhaust valve for opening and closing the exhaust path, the controller controlling the gas supply unit and the exhaust unit, so that the ozone is supplied into the processing chamber from the ozone supply path, in a state of substantially stopping an exhaust of inside of the processing chamber, when the ozone is supplied into the processing chamber.

According to the present invention, when the oxide film is formed by supplying the oxide gas onto the substrates, it is possible to shorten a processing time and improve uniformity of the film thickness in the surface.

BRIEF DESCRIPTION OF THE DRAWINGS

FIG. 5 is a sequence view of the step of forming an oxide film according to a comparative example.

FIG. 6 is a schematic view showing a sequence example 1 of the step of forming the oxide film (step 3) according to a third embodiment of the present invention.

FIG. 7 is a schematic view showing a sequence example 2 of the step of forming the oxide film (step 3) according to the third embodiment of the present invention.

FIG. 8 is a schematic view showing a sequence example 3 of the step of forming the oxide film (step 3) according to the third embodiment of the present invention.

FIG. 10A shows a relation between an increase of an average film thickness and oxidation time of the oxide film in a substrate surface, and FIG. 10B shows a relation between the increase of the film thickness and the oxidation time of the oxide film in a center part of the substrate, respectively.

FIG. 11 is a table chart for explaining examples 7 and 8 of the present invention together with comparative example 3, showing the average thickness and uniformity of the thickness of the oxide film in each case of an upper part and a lower part of a substrate processing position.

FIG. 12 is a table chart showing a composition uniformity of a $HfO_2$ film in each part of an upper part, a middle part, and a lower part of the substrate processing position, wherein FIG. 12A shows the composition uniformity of comparative example 4 and FIG. 12B shows the composition uniformity of example 9, and FIG. 12C shows the composition uniformity of example 10, respectively.

FIG. 14 is a view exemplifying an operation of the gas supply unit and a valve open/close sequence according to the fourth embodiment of the present invention.

DESCRIPTION OF PREFERRED EMBODIMENT OF THE INVENTION

First Embodiment

First, a basic structure of a normal flow type vertical substrate processing apparatus according to a first embodiment of the present invention, and a substrate processing method executed by this substrate processing apparatus will be described.

(1) Structure of a Substrate Processing Apparatus

Figure 1:
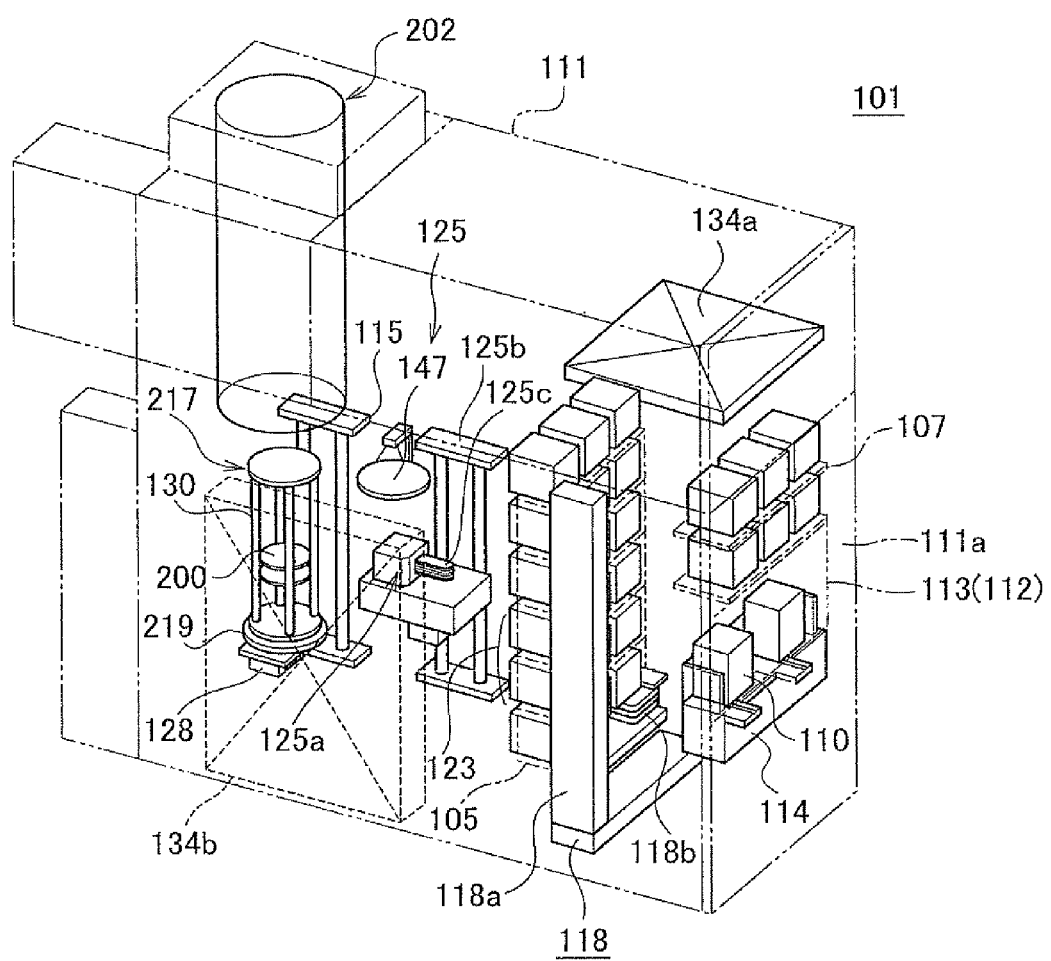
FIG. 1 is a schematic block diagram showing an entire structure of a substrate processing apparatus according to a first embodiment of the present invention.

FIG. 1 is a schematic block diagram showing an entire structure of a substrate processing apparatus according to this embodiment. As shown in the figure, a substrate processing apparatus 101 includes a casing 111. In order to carry a wafer (substrate) 200 made of silicon, etc, into/out of the casing 111, a cassette 110, being a wafer carrier accommodating the wafer (substrate) 200 made of silicon, etc, is used. A front side maintenance port (not shown) is opened, as an opening part opened in a lower part of a front side wall 111a of the casing 111 of the substrate processing apparatus 101, so that maintenance of an inside of the casing 111 can be performed. A front side maintenance door (not shown) for opening/closing this front side maintenance port is built on the front side wall 111a of the casing 111. A cassette loading/unloading port (substrate container loading/unloading port) 112 is opened on the maintenance door, so as to communicate inside and outside of the casing 111. The cassette loading/unloading port 112 is opened and closed by a front shutter (open/close mechanism of the substrate container loading/unloading port) 113. A cassette stage (substrate container transferring stand) 114 is installed inside of the casing 111 of the cassette loading/unloading port 112. The cassette 110 is loaded on the cassette stage 114, and unloaded from the cassette stage 114, by an in-step carrying device (not shown).

The cassette 110 is placed on the cassette stage 114, so that the wafer 200 in the cassette 110 takes a vertical posture, and a wafer charging/discharging port of the cassette 110 is faced upward. The cassette 114 is constituted, so that the cassette 110 is vertically rotated by 90 degrees toward a rear of the casing 111, with the wafer 200 set in a horizontal posture in the cassette 110, and the wafer charging/discharging port of the cassette 110 is faced rearward in the casing 111.

A cassette shelf (substrate container placement shelf) 105 is set in approximately a longitudinally center part in the casing 111. The cassette shelf 105 is constituted, so that a plurality of cassettes 110 are stored in multiple stages and in multiple rows. A transfer shelf 123 is provided on the cassette shelf 105, on which the cassette 110, being a carrying object of a wafer transfer mechanism 125 as will be described later, is stored. Further, a spare cassette shelf 107 is provided in an upper part of the cassette stage 114, for storing the cassette 110 as spare.

A cassette carrying device (substrate container carrying device) 118 is installed between the cassette stage 114 and the cassette shelf 105. The cassette carrying device 118 includes a cassette elevator (substrate container elevation mechanism) 118a capable of elevating the cassette 110 in a state of holding the cassette 110, and a cassette carrying mechanism (substrate container carrying mechanism) 118b, being a carrying mechanism capable of horizontally moving the cassette 110 in a state of holding the cassette 110. By continuous motion of these cassette elevator 118a and cassette carrying mechanism 118b, the cassette 110 is carried among the cassette stage 114, the cassette shelf 105, and the spare cassette shelf 107.

The wafer transfer mechanism (substrate transfer mechanism) 125 is set in the rear of the cassette shelf 105. The wafer transfer mechanism 125 includes a wafer transfer device (substrate transfer device) capable of horizontally rotating or linearly moving the wafer 200, and a wafer transfer device elevator (substrate transfer device elevation mechanism) 125b for elevating the wafer transfer device 125a. Note that the wafer transfer device 125a includes a tweezer (jig for transferring substrates) 125c for holding the wafer 200 in a horizontal posture. The wafer transfer device elevator 125b is installed on a right side end portion of the casing 111 having pressure resistance. By the continuous motion of these wafer transfer device 125a and wafer transfer device elevator 125b, the wafer 200 is picked up from the inside of the cassette 110 on the transfer shelf 123 and charged into a boat (substrate supporting member) 217 as will be described later and discharged form the boat 217, and stored in the cassette 110 on the transfer shelf 123.

A processing furnace 202 is provided in a rear upper part of the casing 111. An opening (furnace port) is formed in a lower end portion of the processing furnace 202. This opening is opened/closed by a furnace port shutter (furnace port open/close mechanism) 147. Note that a structure of the processing furnace 202 will be described later.

A boat elevator (substrate holding tool elevation mechanism) 115, being an elevation mechanism for elevating the boat 217 and carrying it to inside/outside of the processing furnace 202, is provided in a lower part of the processing furnace 202. An arm 128, being a connecting tool, is formed on an elevating stand of the boat elevator 115. A seal cap 219 is provided on the arm 128, as a lid member, for vertically supporting the boat 217 and air-tightly sealing the lower end portion of the processing furnace 202 when the boat 217 is elevated by the boat elevator 115.

The boat 217 includes a plurality of holding members, so that a plurality of (for example, about 50 to 150) wafers 200 are horizontally held respectively, in a state of being arranged in a vertical direction, with centers thereof aligned.

A clean unit 134a including a supply fan and a dust-proof filter is provided above the cassette shelf 105. The clean unit 134a is constituted so that clean air, being cleaned atmosphere, is flown into the casing 111.

Further, a clean unit 134b including the supply fan and the dust-proof filter for supplying clean air is installed on a left side end portion of the casing 111, on the opposite side to the side of the wafer transfer device elevator 125b and the boat elevator 115. The clan air blown out from the clean unit 134b is circulated around the wafer transfer device 125a and the boat 217, then sucked in an exhaust device not shown, and exhausted to the outside of the casing 111.

(2) Operation of the Substrate Processing Apparatus

Next, an operation of the substrate processing apparatus 101 according to this embodiment will be described.

Prior to supplying the cassette 110 to the cassette stage 114, the cassette loading/unloading port 112 is opened by the front shutter 113. Thereafter, the cassette 110 is loaded from the cassette loading/unloading port 112. The cassette 110 is placed on the cassette stage 114, so that the wafer 200 is set in a vertical posture and the wafer charging/discharging port of the cassette 110 is faced upward. Then, the cassette 110 is vertically rotated by 90 degrees toward the rear of the casing 111 by the cassette stage 114. As a result, the wafer 200 in the cassette 110 is set in a horizontal posture, and the wafer charging/discharging port of the cassette 110 is faced rearward in the casing 111.

Next, the cassette 110 is automatically carried and transferred to the cassette shelf 105 and a shelf position designated by the spare cassette shelf 107, then stored temporarily therein, and transferred to the transfer shelf 123 from the cassette shelf 105 or the spare cassette shelf 107, or directly carried to the transfer shelf 123.

When the cassette 110 is transferred to the transfer shelf 123, the wafer 200 is picked up from the cassette 110 through the wafer charging/discharging port by the tweezer 125c of the wafer transfer device 125a, and charged into the boat 217 in the rear of the transfer chamber 124 by the continuous motion of the wafer transfer device 125a and the wafer transfer device elevator 125b. After the wafer 200 is transferred to the boat 217, the wafer transfer device 125a returns to the cassette 110 so that the next wafer 200 is charged into the boat 217.

When previously designated sheets of wafers 200 are charged into the boat 217, the lower end portion of the processing furnace 202, which is closed by the furnace port shutter 147, is opened by the furnace port shutter 147. Subsequently, by elevating the seal cap 219 by the boat elevator 115, the boat 217 holding a group of wafers 200 is loaded into the processing furnace 202.

After loading, arbitrary processing is applied to the wafer 200 in the processing furnace 202. This processing will be described later. In a reversed procedure to the aforementioned procedure, the wafer 200 and the cassette 110 are discharged to outside of the casing 111.

(3) Structure of the Processing Furnace

Next, the structure of the processing furnace 202 according to this embodiment will be described.

Figure 2:
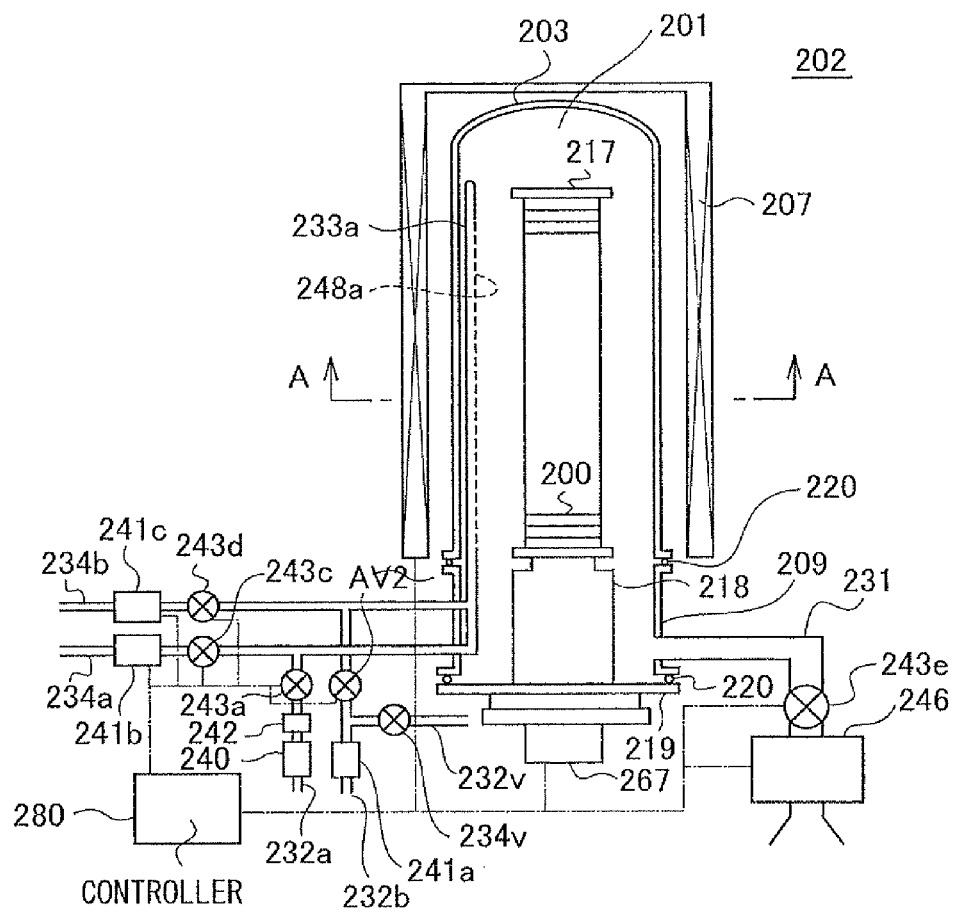
FIG. 2 is a vertical sectional view of a processing furnace of the substrate processing apparatus according to the first embodiment of the present invention.
Figure 3:
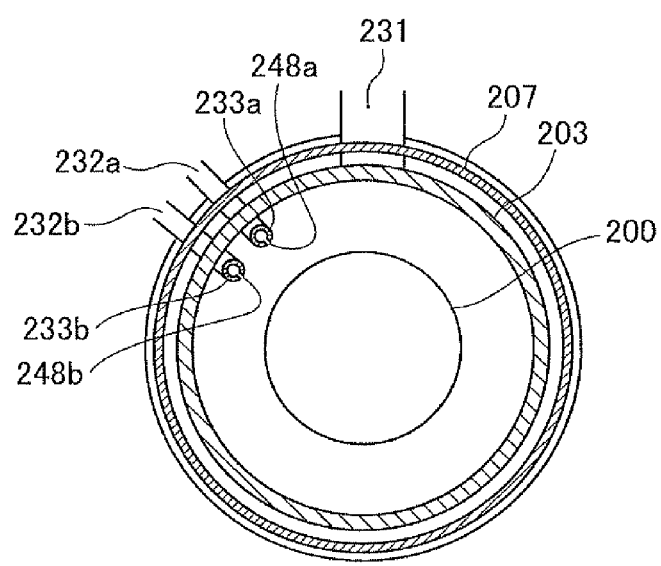
FIG. 3 is a horizontal sectional view corresponding to a sectional face taken along the line A-A of the processing furnace shown in FIG. 2.

FIG. 2 is a vertical sectional view of the processing furnace 202 of the substrate processing apparatus according to this embodiment, and FIG. 3 is a horizontal sectional view corresponding to the line A-A of the processing furnace 202 shown in FIG. 2.

(Processing Chamber)

The processing furnace 202 according to an embodiment of the present invention includes the reaction tube 203 and a manifold 209. The reaction tube 203 is made of a non-metal material having heat resistance property, such as quartz ($SiO_2$) and silicon carbide (SiC), and is formed into a cylindrical shape, with an upper end portion closed and a lower end portion opened. The manifold 209 is made of a metal material such as SUS, and is formed into a cylindrical shape, with the upper end portion and the lower end portion opened. The reaction tube 203 is vertically supported by the manifold 209 from the side of the lower end portion. The reaction tube 203 and the manifold 209 are concentrically disposed. The lower end portion of the manifold 209 is air-tightly sealed by the seal cap 219 when the aforementioned boat elevator 115 is elevated. An O-ring 220, being a sealing member, for air-tightly sealing the inside of the processing chamber 201 is provided between the lower end portion of the manifold 209 and the seal cap 219.

The processing chamber 201 accommodating the wafer 200, being the substrate, is formed inside of the reaction tube 203. The boat 217, being a substrate holding tool, is inserted into the processing chamber 201 from below. Inner diameters of the reaction tube 203 and the manifold 209 are made larger than a maximum outer diameter of the boat 217 into which the wafer 200 is charged.

The boat 217 is constituted so that a plurality of (for example 75 to 100) wafers 200 are held in multiple stages, with prescribed gaps (substrate pitch intervals) provided in approximately horizontal states. The boat 217 is mounted on a heat insulating cap 218 for insulating thermal conduction from the boat 217. The heat insulating cap 218 is supported from below by a rotational shaft 255. The rotational shaft 255 is provided so as to pass through the center part of the seal cap 219, while an air-tight state of the inside of the processing chamber 201 is maintained. A rotating mechanism 267 for rotating the rotational shaft 255 is provided below the seal cap 219. By rotating the rotational shaft 255 by the rotating mechanism 267, the boat 217, on which a plurality of wafers 200 are mounted, can be rotated, while the air-tight state of the inside of the processing chamber 201 is maintained.

A heater 207, being a heating unit (heating mechanism) is provided on an outer periphery of the reaction tube 203, concentrically with the reaction tube 203. The heater 207 has a cylindrical shape, and is vertically installed on a heater base 207a by being supported thereby as a holding plate shown in FIG. 3. The wafer 200 and the atmosphere in the processing chamber are heated by a radiation heat from the heater 207.

(Gas Supply Unit)

A first gas supply nozzle 233a is provided in the manifold 209. The first gas supply nozzle 233a is formed into an L-shape having a vertical portion and a horizontal portion. The vertical portion of the first gas supply nozzle 233a is formed linearly along a loading direction of the wafers 200, and is extended from the lower part of the processing chamber 201 to the vicinity of a ceiling part of the processing chamber 201, through a circular arc shaped space in a planar view, between the inner wall of the reaction tube 203 and the wafer 200 on the boat 217. A plurality of first gas jet holes 248a, being gas inlet ports for introducing gas into the processing chamber 201, are vertically provided on the side face of the vertical portion (cylinder portion) of the first gas supply nozzle 233a. The first gas jet holes 248a are provided at the same pitch as the pitch of loading the wafer 200 held by the boat 217, so that the gas is horizontally flown along the upper surface of each wafer 200 on the boat 217. Further, the first gas jet holes 248a have mutually the same opening areas, to thereby equalize the flow rate of the gas flowing on each wafer 200. Note that an opening diameter of each of the first gas jet holes 248a may be set to be gradually larger from the lower part to the upper part.

The horizontal portion of the first gas supply nozzle 233a is provided so as to pass through the side wall of the manifold 209. The first gas supply tube 232a for supplying source gas (TEHAH gas and TEMAZ gas) obtained by vaporizing a liquid source such as tetrakisdimethyl amino hafnium (Hf[NCH$_3$C$_2$H$_5$]$_4$; TEHAH) and tetrakisdimethyl amino zirconium (TEMAZ) containing element Hf (hafnium) and element Zr (zirconium), is connected to an upper stream end of the first gas supply nozzle 233a. A liquid source supply source, a mass flow controller 240, being a flow rate control device (flow rate controller), a vaporizer 242 for generating the source gas by vaporizing the liquid source, and a first valve 243a, are provided in the first gas supply tube 232a, sequentially from an upper stream.

A first carrier gas supply tube 234a for supplying N$_2$ GAS, being a carrier gas (purge gas), is connected to a lower stream side of the first valve 243a of the first gas supply tube 232a. A carrier gas supply source not shown, a second mass flow controller 241b, being a flow rate control device (flow rate controller), and a third valve 243c are provided in the first carrier gas supply tube 234a, sequentially from the upper stream.

A second gas supply nozzle 233b is provided in the manifold 209. The second gas supply nozzle 233b is formed into an L-shape having the vertical portion and the horizontal portion. The vertical portion of the second gas supply nozzle 233b is formed linearly along the loading direction of the wafers 200, and is extended from the lower part of the processing chamber 201 to the vicinity of the ceiling part of the processing chamber 201, through a circular arc shaped space in a planar view, between the inner wall of the reaction tube 203 and the wafer 200 on the boat 217. A plurality of second gas jet holes 248b, being the gas inlet ports for introducing the gas into the processing chamber 201, are vertically provided on the side face of the vertical portion (cylinder portion) of each second gas supply nozzle 233b. The second gas jet holes 248b are provided at the same pitch as the pitch of loading the wafer 200 held by the boat 217, and are respectively formed so that the gas is horizontally flown along the upper surface of each wafer 200 on the boat 217. Further, the second gas jet holes 248b have mutually the same opening areas, to thereby equalize the flow rate of the gas flowing on each wafer 200. Note that the opening diameter of each of the second gas jet holes 248b may be set to be gradually larger from the lower part to the upper part.

The horizontal portion of the second gas supply nozzle 233b is provided so as to pass through the side wall of the manifold 209. The second gas supply tube 232b for supplying ozone (O$_3$) gas, being the oxide gas, is connected to the upper stream end of the second gas supply nozzle 233b. An ozone gas supply source, a first mass flow controller 241a, being the flow rate control device (flow rate controller), and an ozone supply valve AV2 are provided in the second gas supply tube 232b sequentially from the upper stream.

A vent gas tube 232v is connected between the mass flow controller 241a of the second gas supply tube 232b, and the ozone supply valve AV2. A sixth valve 243v is provided in the vent gas tube 232v. When the ozone gas is not supplied into the processing chamber 201, the sixth valve 243v is opened and ozone is discharged from the vent gas tube 232v, without stopping the generation of ozone, to thereby stably and rapidly start next supply of ozone into the processing chamber 201.

A second carrier gas supply tube 234b for supplying N$_2$ gas, being a carrier gas (purge gas), is connected to the lower stream side of the ozone supply valve AV2 of the second gas supply tube 232b. A carrier gas supply source not shown, a third mass flow controller 241c, being the flow rate control device (flow rate controller), and a fourth valve 243d are provided in the second carrier gas supply tube 243b, sequentially from the upper stream.

A source gas supply unit according to this embodiment is mainly constituted by the first gas supply nozzle 233a, the first gas jet hole 248a, the first gas supply tube 232a, a liquid source supply source not shown, the liquid mass flow controller 240, the vaporizer 242, the first valve 243a, the first carrier gas supply tube 234a, and the second mass flow controller 241b, and the third valve 243c. Also, an oxide gas supply unit according to this embodiment is mainly constituted by the second gas supply nozzle 233b, the second gas getting port 248b, the second gas supply tube 232b, an ozone gas supply source not shown, the first mass flow controller 241a, the ozone supply valve AV2, the vent gas tube 232v, the sixth valve 243v, the second carrier gas supply tube 234b, a carrier gas supply source not shown, the third mass flow controller 241c, and the fourth valve 243d. In addition, a gas supply unit for supplying the source gas and the oxide gas into the processing chamber 201 is mainly constituted by the source gas supply unit and the oxide gas supply unit.

Thus, the gas supply unit for supplying gas of two kinds (the source gas and the oxide gas) into the processing chamber 201, is provided in the substrate processing apparatus 101. Then, a desired film is formed on the wafer 200, by alternate supply of the gas of two kinds into the processing chamber 201. Further, in the film forming step, the inside of the processing chamber 201 is cleaned by being exhausted using a vacuum pump 246, after being purged using the carrier gas. Further, desired processing can be performed by replacing a part of the gas supply unit with a device suitable for processing.

(Exhaust Unit)

An exhaust tube 231 is connected to the side wall of the manifold 209. A fifth valve 243e, being an exhaust valve, and the vacuum pump 246 are provided in the exhaust tube 231 sequentially from the upper stream side. Note that the fifth valve 243e can control start/stop of vacuum exhaust of the processing chamber 201 by opening/closing the valve, and further is constituted as an automatic pressure adjustment valve (APC valve) capable of adjusting a pressure in the processing chamber 201 by adjusting an opening degree of the valve. An exhaust unit for exhausting the atmosphere in the processing chamber 201 is mainly constituted by the exhaust tube 231, the fifth valve 243e, and the vacuum pump 246.

(Controller)

The substrate processing apparatus according to this embodiment includes a controller 280, being a control part (control means). The controller 280 is connected to the liquid mass flow controller 240, first to third mass flow controllers 241a, 241b, 241c, first to sixth valves 243a, 243b, 243c, 243d, 243e, 243v, the heater 207, the vacuum pump 246, the rotating mechanism 267, and a boat elevating mechanism not shown. The controller 280 is constituted to control flow adjustment operation of the liquid mass flow controller 240 and the first to third mass flow controllers 241a, 241b, 241c, open/close operation of the first to fourth and sixth valves 243a, 243b, 243c, 243d, 243c, open/close operation and opening degree adjustment operation of the fifth valve 243e, temperature adjustment operation of the heater 207, start/stop of the vacuum pump 246, rotating speed adjustment of the rotating mechanism 267, and elevating operation of the boat elevating mechanism.

(4) Substrate Processing Step

Next, explanation will be given for the substrate processing step according to this embodiment executed as one of the manufacturing steps of the semiconductor device. The substrate processing step according to this embodiment is executed by the aforementioned substrate processing apparatus (normal flow type vertical substrate processing apparatus). In the explanation given hereunder, the operation of each part constituting the substrate processing apparatus is controlled by the controller 280.

In the substrate processing step according to this embodiment, TEMAH gas is used as the source gas, and ozone gas is used as the oxide gas, to thereby form an $HfO_2$ film on the wafer 200 by using the ALD method. The ALD method, being one of the CVD methods is a method of forming a film by supplying on the substrate the reactive gas of two kinds, being at least sources of two kinds used in film-formation, alternately one by one, which is then adsorbed on the substrate in units of one atom, and film-formation is performed by utilizing a surface reaction. At this time, control of the film thickness is performed by less number of cycles (for example, if a film forming speed is 1 Å/cycle, the reactive gas is supplied by 20 cycles when a film of 20 Å is formed). In the film-formation processing using the ALD method, a processing temperature for depositing HfO and ZrO is set to be 180° C. to 270° C., and for example set to be 250° C. In the ALD method, for example, when the $HfO_2$ film is formed, high quality film-formation is possible at a low temperature such as 180 to 250° C. by using the TEMAH gas and the ozone gas.

(Wafer Loading Step)

First, as described above, the wafer 200 is charged into the boat 217, and is loaded into the processing chamber 201. After the boat 217 is loaded into the processing chamber 201, four steps as will be described later are sequentially executed.

(Source Gas Supplying Step (Step 1))

In step 1, the TEMAH gas, being the source gas, is supplied into the processing chamber 201, while exhausting the atmosphere in the processing chamber 201 in which the wafer 200 is accommodated.

Specifically, the fifth valve 243e of the exhaust tube 231 is opened, and exhaust of the atmosphere in the processing chamber 201 is started. Then, the third valve 243c of the first carrier gas supply tube 234a is opened, and the $N_2$ gas, being the carrier gas, is flown to the first gas supply tube 232a, while adjusting the flow rate by the second mass flow controller 241b. Further, TEMAH, being the liquid source, is flown to the vaporizer 242 from the liquid source supply source not shown to be vaporized, while adjusting the flow rate by the liquid mass flow controller 240, to thereby generate the TEMAH gas. Then, the first valve 243a of the first gas supply tube 232a is opened, and the TEMAH gas generated by the vaporizer 242 is flown to the first gas supply nozzle 233a. The TEMAH gas is mixed with the carrier gas in the first gas supply tube 232a. Mixed gas of the TEMAH gas and the carrier gas is supplied into the processing chamber 201, through the first gas jet hole 248a of the first gas supply nozzle 233a. Surface reaction (chemical adsorption) is caused between TEMAH in the mixed gas supplied into the processing chamber 201, and a surface part of the wafer 200, to thereby form a base film on the wafer 200. An excess portion of the mixed gas not contributing to forming the base film, is exhausted from the exhaust tube 231 as exhaust gas.

At this time, the opening degree of the fifth valve 243e is set, so that the pressure in the processing chamber 201 is set so as to be maintained in a range of 0.1 to 400 Pa, and for example set to be 200 Pa. Further, the flow rate of TEMAH controlled by the liquid mass flow controller 240 is set to be 0.01 to 0.1 g/min, and the time for exposing the wafer 200 to the mixed gas is set to be 30 to 180 seconds. Moreover, the temperature of the heater 207 is adjusted, so that the temperature of the wafer 200 is set to be in a range of 180 to 250° C. and for example set to be 230° C.

(Source Gas Removing Step (Step 2))

In step 2, the TEMAH gas and the intermediate body of the TEMAH gas remained in the processing chamber 201 are removed.

Specifically, the first valve 243a of the first gas supply tube 232a is closed, and supply of the TEMAH gas into the processing chamber 201 is stopped. At this time, the inside of the processing chamber 201 is exhausted by the vacuum pump 246 down to 20 Pa or less, with the fifth valve 243e of the exhaust tube 231 opened, and the residual TEMAH gas and intermediate body of the TEMAH gas are removed from the processing chamber 201. Note that the third valve 243c of the first carrier gas supply tube 234a is opened until removal of the residual TEMAH gas and intermediate body of the TEMAH gas from the processing chamber is completed, and $N_2$, being purge gas, is supplied into the processing chamber 201 while adjusting its flow rate by using the second mass flow controller 241b. Thus, an effect of removing the residual TEMAH gas and intermediate body of the TEMAH gas from the processing chamber 201 is further improved.

(Ozone Supplying Step (Step 3))

In step 3, ozone is supplied into the processing chamber 201, with the exhaust of the atmosphere in the processing chamber 201 substantially stopped.

Specifically, by closing the fifth valve 243e of the exhaust tube 231, the exhaust of inside of the processing chamber 201 is substantially stopped. Then, the fourth valve 243d of the second carrier gas supply tube 234b is opened, and the $N_2$ gas, being the carrier gas, is flown to the second gas supply tube 232b, while adjusting its flow rate by using the third mass flow controller 241c. Further, the ozone supply valve AV2 of the second gas supply tube 232b is opened, and the ozone gas, being the oxide gas, is flown to the second gas supply nozzle 233b, while adjusting its flow rate by using the first mass flow controller 241a. The ozone gas is mixed with the carrier gas in the second gas supply tube 232b. The mixed gas of the ozone gas and the carrier gas are supplied into the processing chamber 201 through the second gas jet hole 248b of the second gas supply nozzle 233b. Ozone in the mixed gas supplied into the processing chamber 201 causes surface reaction with TEMAH which is chemically adsorbed on the surface of the wafer 200, to thereby form the $HfO_2$ film on the wafer 200. An excess portion of the mixed gas not contributing to forming the $HfO_2$ film is exhausted from the exhaust tube 231 as exhaust gas.

At this time, the opening degree of the fifth valve 243e is set, so that the pressure in the processing chamber 201 is maintained in a range of 0.1 to 400 Pa and for example maintained to be 200 Pa. Further, the time for exposing the wafer 200 to $O_3$ is set to be 10 to 120 seconds. Moreover, the temperature of the heater 207 is adjusted, so that the temperature of the wafer 200 is set to be in a range of 180 to 250° C. in the same way as the time for supplying the TEMAH gas of step 1, and for example, set to be 230° C.
(Repeating Step)

Thereafter, the aforementioned steps 1 to 4 are set as one cycle, and by repeating this cycle multiple number of times, the HfO$_2$ film of desired thickness is formed on the wafer 200, and the substrate processing step according to this embodiment is ended. Then, the wafer 200 after processing is unloaded from the processing chamber 201, by a procedure reverse to the wafer loading step.

(5) Advantage of this Embodiment

According to this embodiment, one or a plurality of advantages are exhibited, as shown below.

(a) According to this embodiment, the ozone supplying step (step 3) for supplying ozone into the processing chamber 201 is performed, with exhaust of the atmosphere in the processing chamber 201 substantially stopped. Thus, ozone is diffused and the inside of the processing chamber 201 is reserved with ozone, so that ozone can be sufficiently supplied not only to the outer peripheral edge, but also to the center part of the wafer 200. As a result, the processing time for forming the HfO$_2$ film can be shortened, and homogeneity of distribution of thickness and distribution of composition of the HfO$_2$ film formed on the wafer 200 can be improved.

(b) Further, according to this embodiment, the TEMAH gas and ozone are alternately supplied into the processing chamber 201 so as not to be mixed with each other. Thus, excess vapor phase reaction in the processing chamber 201 can be suppressed, film forming reaction can be efficiently generated on the wafer 200, and the processing time for forming the HfO$_2$ film can be shortened. Moreover, generation of particles in the processing chamber 201 can be suppressed, and homogeneity of the distribution of thickness and distribution of composition of the HfO$_2$ film formed on the wafer 200 can be improved.

(c) Moreover, according to this embodiment, the aforementioned advantage can be obtained, by performing the ozone supplying step (step 3), with exhaust of the atmosphere in the processing chamber 201 substantially stopped, and there is no necessity for supplying ozone of large flow rate into the processing chamber 201. Therefore, waste of ozone can be suppressed, and cost required for processing substrates can be reduced.

Second Embodiment

Next, a basic structure of the side flow type vertical substrate processing apparatus and a substrate processing method using this substrate processing apparatus, according to a second embodiment of the present invention will be described.

Figure 18:
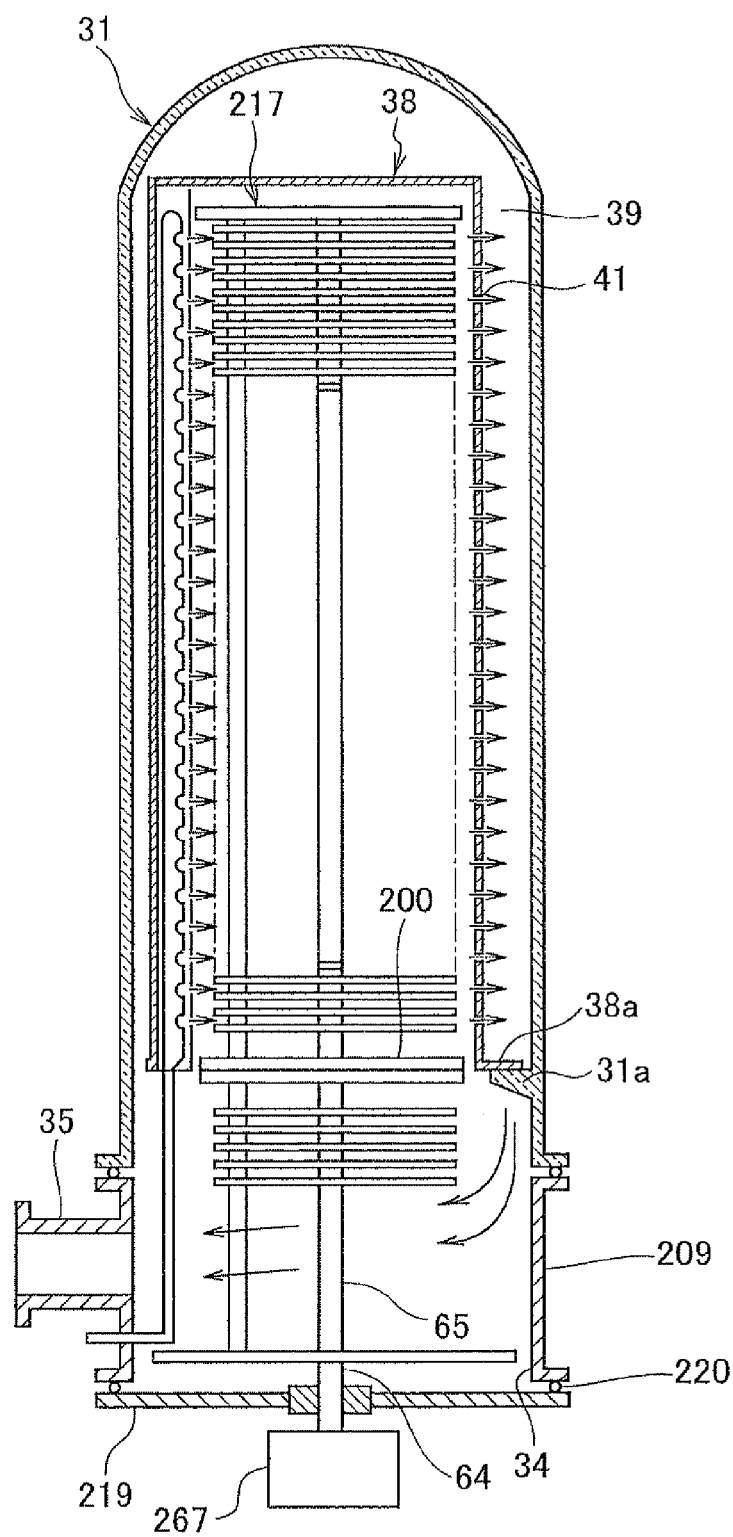
FIG. 18 is a vertical sectional view of a processing furnace of the side flow type vertical substrate processing apparatus according to a second embodiment of the present invention.

As shown in FIG. 18, the substrate processing apparatus according this embodiment is different from the substrate processing apparatus according to the aforementioned embodiment, in the point that the reaction tube 203 is constituted of an outer tube 31 and an inner tube 38 disposed inside of the outer tube 31. In addition, the substrate processing apparatus according to this embodiment is different from the substrate processing apparatus according to the aforementioned embodiment in the point that a plurality of exhaust ports 41 are provided on the side wall of the inner tube 38 so that exhaust passed through the plurality of exhaust ports 41 is discharged from an exhaust port 35 provided in a lower part of the outer tube 31. Other structure is the same as that of the normal flow type vertical substrate processing apparatus.

The side flow type vertical substrate processing apparatus will be described below, focusing on these different points.

FIG. 18 is a vertical sectional view of a side flow type processing furnace according to this embodiment. As shown in the figure, the reaction tube according to this embodiment is constituted of the outer tube 31, and the inner tube 38 disposed inside of the outer tube 31. The outer tube 31 and the inner tube 38 are respectively made of non-metal materials having heat resistance property, such as quartz (SiO$_2$) and silicon carbide (SiC), and have a cylindrical shape, with the upper end portion closed and the lower end portion opened. The outer tube 31 is vertically supported by the manifold 209 from the side of the lower end portion. A receiver base 31a projecting toward inside is formed on an inner wall surface of the lower part of the outer tube 31. A plurality of projection parts 38a projecting toward outside are formed on an outer wall surface of the lower part of the inner tube 38. The inner tube 38 is vertically supported from below in the outer tube 31, by setting the projection parts 38a on the receiver base 31a. Cylindrical space 39 extending vertically is formed between the outer wall surface of the inner tube 38 and the inner wall surface of the outer tube 31. The processing chamber 201 is formed inside of the inner tube 38, so that the boat 217 is inserted from below.

The vertical portion of the first gas supply nozzle 233a and the vertical portion of the second gas supply nozzle 233b are respectively extended to the vicinity of the ceiling part of the processing chamber 201, through a circular arc-shaped space in planar view, between the inner wall of the inner tube 38 and the wafer 200 on the boat 217.

A plurality of exhaust ports 41 are provided at positions opposed to the first gas supply nozzle 233a and the second gas supply nozzle 233b. The plurality of exhaust ports 41 are provided at the same pitch as the pitch of loading the wafer 200 held by the boat 217 (namely, an arrangement pitch of the first gas jet holes 248a and the second gas jet holes 248b), so that the gas is horizontally flown along the upper surface of each wafer 200 on the boat 217. Note that the exhaust port 35, with the exhaust tube 231 connected thereto, is formed on the lower part of the side wall of the manifold 209 (below the lower end of the inner tube 38).

In addition, a furnace port 34, being an opening, is formed on the lower end of the manifold 209. The furnace port 34 is constituted so as to be sealed by a seal cap 219, being a disc (lid member) having an outer diameter larger than an inner diameter of the furnace port 34, through an O-ring (seal ring) 220. In addition, a rotational shaft 64 of the rotating mechanism 267 is provided so as to pass through an axial center part of the seal cap 219. A support stand is vertically erected on the upper end of the rotational shaft 64. The boat 217, being a substrate holding tool, is vertically erected on the support stand.

When the boat holding a plurality of wafers 200 is inserted into the processing chamber 200 and the processing chamber 201 is sealed by the seal cap 219, the inside of the processing chamber 201 is exhausted down to a prescribed pressure or less, by the vacuum pump 246 connected to the exhaust tube 231, and the temperature inside of the processing chamber 201 is raised to a prescribed temperature. Then, the boat 217 is rotated by a rotational shaft 62 of a rotation driving mechanism 63. With a structure of a hot wall type furnace structure, the temperature in the processing chamber 201 is maintained uniformly over the whole, and temperature distribution of the boat 217 and each wafer 200 held thereby is also uniform over the whole.

According to this embodiment, one or a plurality of effects shown below are further exhibited, in addition to the aforementioned effects.

(a) According to this embodiment, the first gas supply nozzle 233a, the second gas supply nozzle 233b are provided inside of the inner tube 38, so as to be extended in a loading direction of the plurality of wafers 200. Further, a plurality of exhaust ports 41 are provided at positions of the inner tube 38 opposed to the first gas supply nozzle 233a and the second gas supply nozzle 233b. Thus, a horizontal flow of the source gas and the oxide gas can be formed over each wafer 200. Then, uniformity in the surface of the $HfO_2$ film, etc, formed on each wafer 200 can be improved.

(b) In addition, according to this embodiment, the first gas supply nozzle 233a and the second gas supply nozzle 233b are disposed so as to be close to the outer edge of the wafer 200 held by the boat 217. Thus, supply efficiency of the source gas and the oxide gas to the wafer 200 can be improved, and productivity of processing substrates can be improved. In addition, supply amount of the gas to the vicinity of the center of the wafer 200 can be increased, and the uniformity in the surface of the thickness of the $HfO_2$ film formed on the wafer 200 can be improved.

(c) In addition, according to this embodiment, vertically continued space 39 is formed between the outer wall surface of the inner tube 38 and the inner wall surface of the outer tube 31. Further, the exhaust port 35 is provided on the lower side of the opening end of the inner tube 38. Thus, both of the gas passed through the space 39 between the inner tube 38 and the outer tube 31, and the gas from the opening end of the inner tube can be simultaneously exhausted, and replacement efficiency of the gas can be improved.

Figure 19:
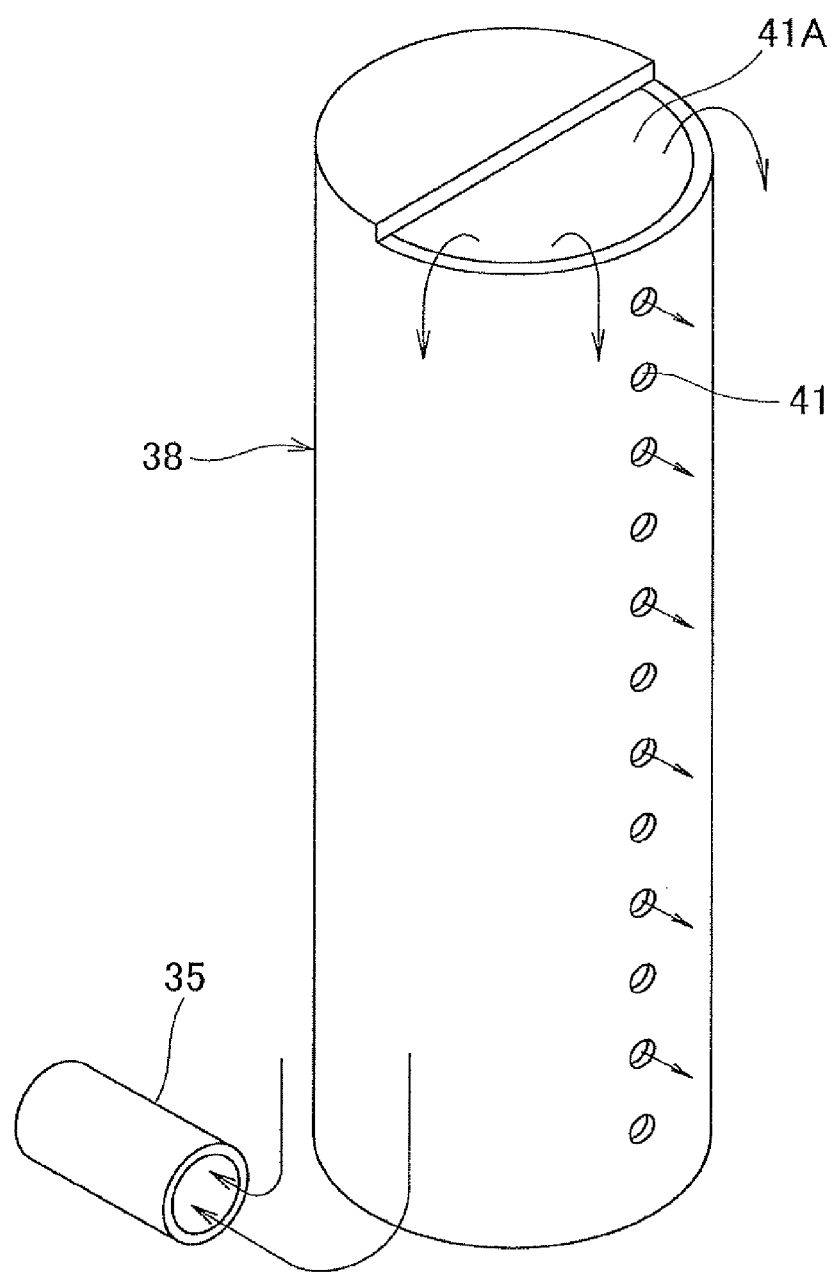
FIG. 19 is a perspective view showing a modified example of an inner tube of the substrate processing apparatus according to the second embodiment of the present invention.

FIG. 19 is a perspective view showing a modified example of the inner tube 38 shown in FIG. 18.

A different point from the substrate processing apparatus explained in FIG. 18 is a point that exhaust port 41A is opened on a ceiling wall of the inner tube 38. The exhaust port 41A is provided on the opposite side (the side of a plurality of exhaust ports 41) to the side where the exhaust tube 231 is provided. According to this modified example, the horizontal flow of the gas jetted from the first gas jet hole 248a of the first gas supply nozzle 233a, and the gas jetted from the second gas jet hole 248b of the second gas supply nozzle 233b can be respectively suppressed, and gas purge efficiency in the processing chamber 201 can be improved. Note that it is desirable to set the size of the exhaust port 41A to be optimum, by comparing a horizontal flow suppressing effect and the gas purge efficiency.

Third Embodiment

Next, explanation will be given for the structure of the substrate processing apparatus according to the third embodiment of the present invention, and the substrate processing step executed by this substrate processing apparatus.

(1) Structure of the Substrate Processing Apparatus

Figure 4:
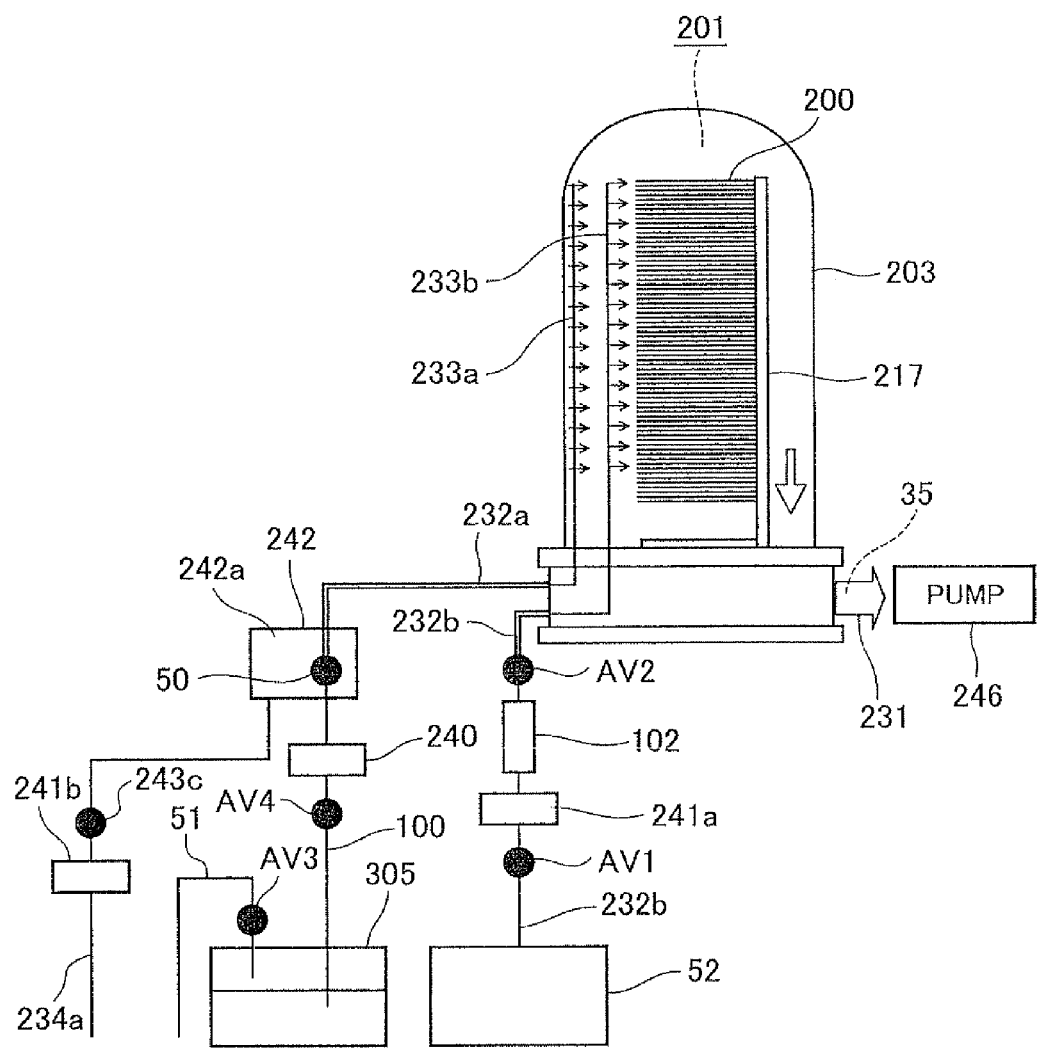
FIG. 4 is a schematic block diagram of the processing furnace and a gas supply unit of the substrate processing apparatus according to a third embodiment of the present invention.

First, the structure of the substrate processing apparatus according to this embodiment will be described, with reference to FIG. 4. FIG. 4 is a schematic block diagram of the processing furnace and the gas supply unit of the substrate processing apparatus according to this embodiment. This embodiment is different from the aforementioned embodiment in the point that the ozone gas, being the oxide gas, is supplied into the processing chamber 201 pulsatively by the gas supply unit (flush supply). Note that the structure other than the gas supply unit is the same as that of the first embodiment, excluding an oxidation sequence of the controller 280. The structure of the gas supply unit of the substrate processing apparatus according to this embodiment will be described hereinafter.

As shown in FIG. 4, a lower stream end of the first gas supply tube 232a is connected to the upper stream end of the first gas supply nozzle 233a. The upper stream end of the first gas supply tube 232a is connected to the secondary side (outlet) of a vaporizing chamber 242a formed in the vaporizer 242. The lower stream end of a transfer tube 100 is connected to the primary side (inlet) of the vaporizing chamber 242a. The upper stream end of the transfer tube 100 is inserted (immersed) into the TEMAH, being a liquid source stored in a tank 305 as a liquid source supply source. A valve AV4 and the liquid mass flow controller 240 are provided in the transfer tube 100 sequentially from the upper stream side. The lower stream end of a compressed gas supply tube 51 is connected to an upper space of the TEMAH stored in the tank 305, so that the $N_2$ gas, being the compressed gas, is supplied from the compressed gas supply tube 51. A valve AV3 is provided in the compressed gas supply tube 51. The lower stream end of the first carrier gas supply tube 234a is connected to the inside of the vaporizing chamber 242a, so that the $N_2$ gas, being the carrier gas (purge gas) is supplied thereto. A carrier gas supply source not shown, the second mass flow controller 241b, and the third valve 243c are provided sequentially from the upper stream side, in the first carrier gas supply tube 234a. A switching valve 50 is provided in the vaporizer 242. By this switching valve 50, switching is possible to either one of a switching position (called a carrier gas supply position hereinafter) for communicating the inside of the tank 305 and the vaporizing chamber 242a, and a switching position (called a carrier gas supply position) for communicating the first carrier gas supply tube 234a and the first gas supply tube 232a through the vaporizing chamber 242a.

The lower stream end of the second gas supply tube 232b is connected to the upper stream end of the second gas supply nozzle 233b. An ozonizer 52, being an ozone generating apparatus, an ozone inlet valve AV1, the first mass flow controller 241a, a buffer tank 102, being a gas reservoir connected to the processing chamber 201, and an ozone supply valve AV2 are provided in the second gas supply tube 232b. The ozonizer 52 is an apparatus for generating ozone gas from oxygen ($O_2$) by discharge. Oxygen gas is supplied to the ozonizer 52 from an oxygen gas supply line not shown. The buffer tank 102, being the gas reservoir, is constituted as a pressure vessel temporarily charged with ozone gas supplied into the processing chamber 201 pulsatively. Namely, after the inside of the buffer tank 102 is temporarily charged with ozone gas supplied from the ozonnizer 52, this ozone gas is supplied (flush-supplied) into the processing chamber 201 pulsatively. Note that in this embodiment, the second carrier gas supply tube 234b is removed, unlike the substrate processing apparatus according to the first embodiment.

Regarding the source gas generated by vaporization of the liquid source in the vaporizer 242, re-liquefaction is apt to occur depending on its type. Therefore, a supply route of the source gas (the upper stream side of the first gas supply tube 232a and the first gas supply nozzle 233a) to the processing chamber 201 from the secondary side of the vaporizer 242 (outlet) is heated to a prescribed temperature (for example, 130° C. when TEMAZ is used as the liquid source), to thereby suppress the re-liquefaction of the source gas. Specifically, a ribbon heater (not shown), etc, is provided on an outer surface of the aforementioned supply route of the source gas (the upper stream side of the first gas supply tube 232a and the first gas supply nozzle 233a).

In addition, in order to accelerate vaporization of the liquid source in the vaporizer 242, the supply route (transfer tube 100) of the liquid source from the tank 305 to the vaporizer 242 is heated to a prescribed temperature, to thereby preheat the liquid source supplied to the vaporizer 242. Specifically, the ribbon heater (not shown), etc, is provided on the outer surface of the supply route (transfer tube 100) of the liquid source.

Figure 15:
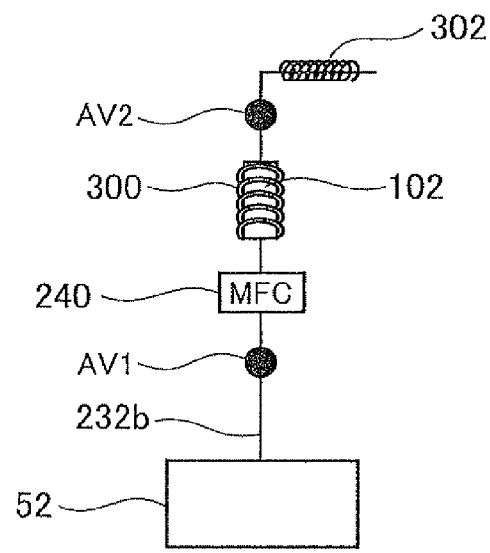
FIG. 15 is a view exemplifying a cooling structure of a buffer tank according to the third embodiment of the present invention.
Figure 16:
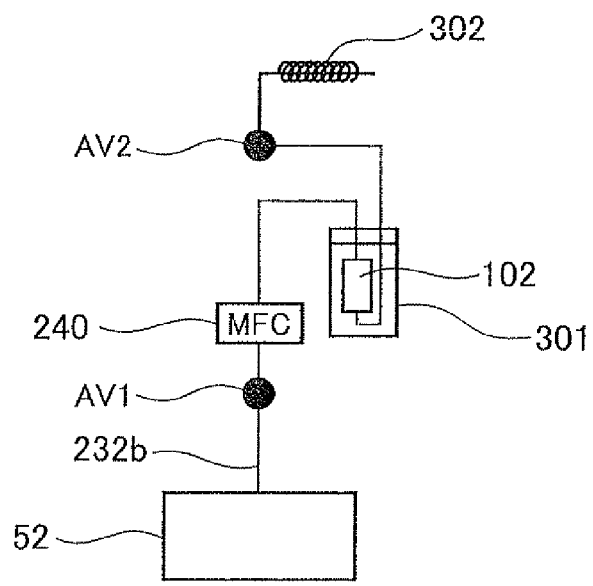
FIG. 16 is a view exemplifying other cooling structure of the buffer tank according to the third embodiment of the present invention.

Note that when the ribbon heater (not shown) is provided on the outer surface of the supply route (the upper stream side of the transfer tube 100, the first gas supply tube 232a, and the first gas supply nozzle 233a) of the liquid source and the source gas, to thereby heat the inside of the supply route, the inside of the buffer tank 102 is also heated by heat conduction, thus decomposing ozone reserved into the buffer tank 102. Therefore, the inside of the buffer tank 102 is cooled. For example, as shown in FIG. 15, a cooling coil 300 is provided on the outer surface of the buffer tank 102, and by flowing a heat exchanging medium such as chilling water and industrial water into the cooling coil 300, the buffer tank 102 is cooled. In addition, as shown in FIG. 16, it is also acceptable that the buffet tank 102 is provided inside of a thermostatic bath 301, and the temperature of the inside of the thermostatic bath 301 is kept to be within a range of −20 to +25° C., for example, around 23° C. Further, although not shown, the buffet tank 102 may also be cooled by use of a Peltier element. With this structure, it is possible to suppress a situation in which ozone is decomposed in the buffer tank 102 before it reaches the processing chamber 201, then stabilize the supply of the ozone gas into the processing chamber 201, and suppress waste of ozone.

In addition, ozone reserved into the buffer tank 102 is reacted with the inner wall surface of the buffer tank 102, and is deactivated in some cases. Therefore, the inner wall surface of the buffer tank 102 is coated with a coating film, to thereby suppress the reaction between the inner wall surface of the buffer tank 102 and the ozone gas. For example, oxide films of iron (Fe), titanium (Ti), aluminum (Al), nickel (Ni), or chromium (Cr) (Fe oxide film, Ti oxide film, Al oxide film, Ni oxide film, and Cr oxide film) can be used as the kind of the coating film. It is also acceptable that an inner surface of the buffer tank 102 is coated with a stainless film such as SUS316, or the buffer tank 102 is constituted of stainless steel such as SUS316. In a stainless steel containing chromium, chromium oxide, etc, is easily formed by oxidation processing, and a stable immobility film (oxide film) is thereby formed. Therefore, it is possible to prevent the deactivation of ozone reserved into the buffer tank 102.

Further, the deactivation of ozone is suppressed not only on the inner wall surface of the buffer tank 102, but also in a supply path of the ozone gas, namely, on the inner wall surface of the second gas supply tube 232b. Specifically, the inner wall surface of the second gas supply tube 232b is coated with the aforementioned coating film. In addition, it is also acceptable that the second gas supply tube 232b is constituted of stainless, and the immobility film made of chromium oxide is formed on the inner wall surface of the second gas supply tube 232b.

In addition, in order to form the immobility film made of chromium oxide on the inner wall surface of the buffer tank 102 and the inner wall surface of the second gas supply tube 232b, a coating step is executed, for supplying ozone to the second gas supply tube 232b from the ozonizer 52, in a state of sufficiently removing moisture inside of the buffer tank 102 and the second gas supply tube 232b. At this time, the ozone inlet valve AV1 and the ozone supply valve AV2 are opened, and other valves are closed. As a result, the surface of each part made of stainless is exposed to ozone and oxidized, and on this surface, a stable immobility film made of chromium oxide, etc, is formed. Thus, the deactivation of ozone can be suppressed, and wasteful consumption of ozone can be prevented. In addition, the coating step of forming the immobility film made of chromium oxide on the inner wall surface of the buffer tank 102 and the inner wall surface of the second gas supply tube 232b may be performed before the substrate processing step as will be described later is started.

(2) Substrate Processing Step

Next, the substrate processing step according to this embodiment executed as one of the manufacturing steps of a semiconductor device will be described. The substrate processing step according to this embodiment has an ozone reserving step of reserving ozone into the buffer tank 102 connected to the processing chamber 201, before the ozone supplying step, and in the ozone supplying step, ozone reserved into the buffer tank 102 is supplied (flush-supplied) pulsatively into the processing chamber 201, and this point is different from the first and second embodiments. In this embodiment, the ozone filing step, the ozone supplying step, and the ozone removing step are repeated multiple number of times. The substrate processing step according to this embodiment is executed by the substrate processing apparatus shown in FIG. 4. In the following explanation, an operation of each part constituting the substrate processing apparatus is controlled by the controller 280.

(Wafer Loading Step)

First, as described above, the wafer 200 is charged into the boat 217, and is loaded into the processing chamber 201. After the boat 217 is loaded into the processing chamber 201, five steps as will be described later are sequentially executed.

(Source Gas Supplying Step (Step 1))

In step 1, TEMAH gas, being a source gas, is supplied into the processing chamber 201, while exhausting an atmosphere in the processing chamber 201 in which the wafer 200 is accommodated.

Specifically, the fifth valve 243e of the exhaust tube 231 is opened, and exhaust of the atmosphere in the processing chamber 201 is started. Further, the valve AV3 is opened, and the $N_2$ gas, being the compressed gas, is supplied to an upper space of the TEMAH stored in the tank 305. Moreover, the switching valve 50 is formed at a source gas supplying position, then the valve AV4 is opened, and TEMAH stored in the tank 305 is fed to the vaporizer 242 (vaporizing chamber 242a) in a compressed state, with its flow rate adjusted by the liquid mass flow controller 240, to thereby generate the TEMAH gas. Further, the first valve 243a of the first gas supply tube 232a is opened, and the $N_2$ gas, being the carrier gas, is supplied to the vaporizer 242 (vaporizing chamber 242a), with its flow rate adjusted by the second mass flow controller 241b. As a result, mixed gas of the TEMAH gas and the carrier gas is supplied into the processing chamber 201, through the first gas jet hole 248a of the first gas supply nozzle 233a. The TEMAH in the mixed gas supplied into the processing chamber 201 causes surface reaction (chemical adsorption) with a surface part, etc, of the wafer 200, and a base film is formed on the wafer 200. An excess portion of the mixed gas not contributing to forming the base film is exhausted from the exhaust tube 231 as exhaust gas.

At this time, the opening degree of the fifth valve 243*e* is set, so that the pressure in the processing chamber 201 is maintained in a range of 0.1 to 400 Pa, for example, 200 Pa. In addition, the flow rate of the TEMAH controlled by the liquid mass flow controller 240 is set to be 0.01 to 0.1 g/min, and the time for exposing the wafer 200 to the mixed gas is set to be 30 to 180 seconds. Further, the temperature of the heater 207 is set, so that the temperature of the wafer 200 is set in a range of 180 to 250° C., and for example, 230° C.

(Source Gas Removing Step (Step 2))

In step 2, the TEMAH gas and the intermediate body of the TEMAH gas remained in the processing chamber 201 are removed.

Specifically, the switching valve 50 of the vaporizer 242 is formed at a carrier gas supplying position, and the supply of the TEMAH gas into the processing chamber 201 is stopped. At this time, the inside of the processing chamber 201 is exhausted until the pressure becomes 20 Pa or less by using the vacuum pump 246, with the fifth valve 243*e* of the exhaust tube 231 opened, and the third valve 243*c* of the first carrier gas supply tube 234*a* is kept open, until the removal of the residual TEMAH gas and intermediate body of the TEMAH gas from the processing chamber 201 is completed, and $N_2$, being the purge gas, is supplied into the processing chamber 201, with its flow rate adjusted by the second mass flow controller 241*b*. Thus, an effect of removing the residual TEMAH gas and intermediate body of the TEMAH gas from the processing chamber 201 is further increased.

(Oxide Film Forming Step (Step 3))

Next, an oxide film forming step (step 3) is executed, in which the step of reserving ozone into the buffer tank 102, being a gas reservoir connected to the processing chamber 201 (ozone filing step (step 3*a*), the step of supplying into the processing chamber 201 ozone reserved into the buffer tank 102 (step 3*b*), and the step of exhausting the atmosphere of the processing chamber 201 (ozone removing step (step 3*c*) are repeated multiple number of times.

Sequence examples 1 to 3 of the oxide film forming step (step 3) are respectively shown in FIG. 6 to FIG. 8.

(Sequence Example 1)

FIG. 6 shows a sequence example 1 of the oxide film forming step (step 3).

In the sequence example 1, as shown in [1] of FIG. 6, the ozone inlet valve AV1 is opened, with the fifth valve (APC) 243*e* opened and the ozone supply valve AV2 closed, and ozone gas is supplied into the buffer tank 102, with its flow rate adjusted by the first mass flow controller 241*a* (ozone reserving step (step 3*a*).

When a prescribed time is elapsed, then a prescribed amount of the ozone gas is reserved into the buffer tank 102, and the pressure in the buffer tank 102 reaches, for example, 100000 Pa, as shown in [2] of FIG. 6, the ozone supply valve AV2 is opened, and the ozone gas reserved into the buffer tank 102 is supplied into the processing chamber 201 (ozone supplying step (step 3*b*). In the ozone supplying step (step 3*b*), the ozone gas reserved into the buffer tank 102 is supplied (flush-supplied) into the processing chamber 201 pulsatively. The ozone gas causes surface reaction with TEMAH which is chemically adsorbed on the surface of the wafer 200, to thereby form the $HfO_2$ film on the wafer 200. In addition, in the ozone supplying step (step 3*b*), the pressure in the processing chamber 201 immediately after supplying ozone is set to be, for example, within a range of 0.1 to 1000 Pa.

After a prescribed time is elapsed, ozone and the intermediate body of ozone remained in the processing chamber 201 are removed (ozone removing step (step 3*c*). Specifically, the ozone supply valve AV2 of the second gas supply tube 232*b* is closed, and the supply of the ozone gas into the processing chamber 201 is stopped. At this time, the inside of the processing chamber 201 is exhausted by the vacuum pump 246 until the pressure thereof becomes 20 Pa or less, with the fifth valve 243*e* of the exhaust tube 231 opened, and the residual ozone and intermediate body of ozone are removed from the processing chamber 201. Note that if the fourth valve 243*d* of the second carrier gas supply tube 234*b* are opened until removal of the residual ozone and intermediate body of ozone from the processing chamber 201 is completed and in this state, when $N_2$, being purge gas, is supplied into the processing chamber 201, with its flow rate adjusted by the third mass flow controller 241*c*, the effect of removing the residual ozone and intermediate body of ozone from the processing chamber 201 can be further increased.

Then, the ozone reserving step (step 3*a*), the ozone supplying step (step 3*b*), and the ozone removing step (step 3*c*) are set as one cycle, and this cycle is repeated multiple number of times.

(Sequence Example 2)

FIG. 7 shows a sequence example 2 of the oxide film forming step (step 3). In the sequence example 2, the exhaust inside of the processing chamber 201 is stopped, when the ozone supplying step (step 3*b*) is executed.

In the sequence example 2, first, as shown in [1] of FIG. 7, the ozone inlet valve AV1 is opened, with the fifth valve (APC) 243*e* opened and the ozone supply valve AV2 closed, and the ozone gas is supplied into the buffer tank 102, with its flow rate adjusted by the first mass flow controller 241*a* (ozone reserving step (step 3*a*)).

After a prescribed time is elapsed, when a prescribed amount of ozone gas is reserved into the buffer tank 102, and the pressure in the buffer tank 102 reaches, for example, 100000 Pa, as shown in [2] of FIG. 7, the fifth valve (APC) 243*e* is closed, and the ozone supply valve AV2 is opened, and the ozone gas reserved into the buffer tank 102 is supplied into the processing chamber 201 (ozone supplying step (step 3*b*)). In the ozone supplying step (step 3*b*), the ozone gas reserved into the buffer tank 102 is supplied (flush-supplied) into the processing chamber 201 pulsatively. The ozone gas causes surface reaction with TEMAH which is chemically adsorbed on the surface of the wafer 200, to thereby form the $HfO_2$ film on the wafer 200. In addition, in the ozone supplying step (step 3*b*), the pressure in the processing chamber 201 immediately after supplying ozone is set to be, for example, within a range of 0.1 to 1000 Pa.

Thereafter, in the same way as the sequence example 1, the ozone removing step (step 3*c*) is executed. Then, the ozone reserving step (step 3*a*), the ozone supplying step (step 3*b*), and the ozone removing step (step 3*c*) are set as one cycle, and this cycle is repeated multiple number of times.

(Sequence Example 3)

FIG. 8 shows a sequence example 3 of the oxide film forming step (step 3). In the sequence example 3, the opening degree of the fifth valve (APC) 243*e* is adjusted when the ozone supplying step (step 3*b*) is executed, and the ozone gas is supplied into the processing chamber 201, while adjusting the pressure in the processing chamber 201 to be an average pressure.

In the sequence example 2, first, as shown in [1] of FIG. 8, the ozone inlet valve AV1 is opened, with the fifth valve (APC) 243*e* opened and the ozone supply valve AV2 closed, and the ozone gas is supplied into the buffer tank 102, with its flow rate adjusted by the first mass flow controller 241a (ozone reserving step (step 3a).

After a prescribe time is elapsed, when a prescribed amount of ozone gas is reserved into the buffer tank 102, and the pressure in the buffer tank 102 reaches, for example, 100000 Pa, as shown in [2] of FIG. 8, the opening degree of the fifth valve (APC) 243e is adjusted, and the ozone supply valve AV2 is opened, to thereby supply into the processing chamber 201 the ozone gas reserved into the buffer tank 102 (ozone supplying step (step 3b). In the ozone supplying step (step 3b), the ozone gas reserved into the buffer tank 102 is supplied (flush-supplied) into the processing chamber pulsatively. The ozone gas causes surface reaction with TEMAH which is chemically adsorbed on the surface of the wafer 200, to thereby form the $HfO_2$ film on the wafer 200. In addition, in the ozone supplying step (step 3b), the pressure in the processing chamber 201 immediately after supplying ozone is set in a range, for example 0.1 to 1000 Pa.

Thereafter, in the same way as the sequence example 1, the ozone removing step (step 3c) is executed. Then, the ozone reserving step (step 3a), the ozone supplying step (step 3b), and the ozone removing step (step 3c) are set as one cycle, and this cycle is repeated multiple number of times.

Note that in any one of the sequence examples, the ozone reserving step (step 3a) executed at least in an initial time of repetition is executed simultaneously with the aforementioned source gas supplying step (step 1) and/or the source gas removing step (step 2). Namely, the step 3a is executed simultaneously with the source gas supplying step (step 1), simultaneously with the source gas removing step (step 2), or simultaneously with the source gas supplying step (step 1) and the source gas removing step (step 2). In addition, the ozone reserving step (step 3a) executed in a second time of repetition may also be executed simultaneously with the ozone removing step (step 3c). Namely, after the ozone supplying step (step 3b) is executed, the timing of restarting the reserving of the ozone gas into the buffer tank 102 may be set after execution of the ozone supplying step (step 3b) is completed.

Further, in any one of the sequence examples, the temperature of the second gas supply tube 232b connecting the buffer tank 102 and the processing chamber 201 to a second temperature, while heating the wafer 200 to a first temperature (in a range of 180 to 250° C., and for example 230° C.), and further the temperature of the buffer tank 102 is cooled to a third temperature. At this time, the first temperature is set to be higher than the second temperature, and the second temperature is set to be higher than the third temperature. Thus, it is possible to prevent ozone from being decomposed in the buffer tank 102.

(Repeating Step)

Thereafter, the aforementioned source gas supplying step (step 1) to the oxide film forming step (step 3) are set as one cycle, and this cycle is repeated multiple number of times, to thereby form the $HfO_2$ film of a prescribed thickness on the wafer 200, and the substrate processing step according to this embodiment is ended. Then, the wafer 200 after processing is unloaded from the processing chamber 201, in a reversed procedure to the aforementioned procedure.

Note that in this embodiment, a volume ratio of the buffer tank 102 to the processing chamber 201 is set to be, for example, 1/2100 to 1/105. For example, when the volume of the processing chamber 201 is set to be 210 L, the volume of the buffer tank 102 is set to be 0.1 L to 2 L. This is because when the volume ratio becomes under 1/2100, a flow speed of the ozone gas supplied into the processing chamber 201 pulsatively becomes almost the same as the flow speed of the ozone gas when the buffer tank 102 is not used, and the effect obtained by using the buffer tank 102 is hardly obtained. Also, this is because when the volume ratio exceeds 1/105, the pressure in the processing chamber 201 becomes too high, when the ozone gas is supplied into the processing chamber 201 from the buffer tank 102 pulsatively, and this is not preferable.

Further, the pressure of the ozone gas reserved into the buffer tank 102 is set in a range of 200 to 101, 130 Pa, and set to be, for example, 100000 Pa. This is because when the pressure of the ozone gas reserved into the buffer tank 102 becomes under 200 Pa, the flow speed of the ozone gas pulse-supplied into the processing chamber 201 becomes almost the same as the flow speed of the ozone gas when the buffer tank 102 is not used, and the effect obtained by using the buffer tank 102 is hardly obtained. Also, when the pressure of the ozone gas reserved into the buffer tank 102 exceeds 101, 130 Pa, a differential pressure between a pressure of supplying the ozone gas into the processing chamber 201 and a pressure of the ozone gas reserved into the buffer tank 102, is not taken when the ozone gas is supplied into the processing chamber 201 pulsatively, thus making it impossible to control the flow rate. This is not preferable.

Further, the pressure in the processing chamber 201 during executing the ozone supplying step (step 3b) is set to be 0.1 to 1000 Pa. This is because when the pressure of the processing chamber 201 during executing the ozone supplying step (step 3b) becomes under 0.1 Pa, ozone supply to the surface of the wafer 200 becomes insufficient. Moreover, this is because when the pressure in the processing chamber 201 during executing the ozone supplying step (step 3b) becomes 1000 Pa or more, an exhaust speed of the vacuum pump 246 is decreased.

(3) Effect According to this Embodiment

According to this embodiment, one or a plurality of effects as shown below are further exhibited, in addition to the aforementioned effect.

(a) According to this embodiment, the ozone reserving step (step 3a) for reserving ozone into the buffer tank 102, being a gas reservoir, is executed, before the ozone supplying step (step 3b). Then, in the ozone supplying step (step 3b), ozone reserved into the buffer tank 102 is supplied (flush-supplied) into the processing chamber 201 pulsatively. Thus, a supply amount of ozone to the wafer 200 is increased, and delay in oxidation of the base film in the center part of the wafer 200 is suppressed. Then, uniformity of the film thickness distribution and the composition distribution of the $HfO_2$ film formed on the surface of the wafer 200 is improved, and a manufacturing yield of the semiconductor device can be improved.

(b) In addition, according to this embodiment, the supply amount of ozone to the wafer 200 is increased, without supplying a large flow rate of the oxide gas containing high density ozone to the wafer 200, and delay in oxidation of the base film in the center part of the wafer 200 can be suppressed. Therefore, waste of ozone is suppressed, then the cost of processing substrates can be reduced, and throughput (productivity) of processing substrates can be improved.

(c) Further, according to this embodiment, a ribbon heater (not shown), etc, is provided on an outer surface of a supply route of the source gas from the secondary side (outlet) of the vaporizer 242 to the processing chamber 201 (the upper stream side of the first gas supply tube 232a and the first gas supply nozzle 233a), to thereby heat the source gas to a prescribed temperature (for example, 130° C. when TEMAZ is used as the liquid source). Thus, re-liquefaction of the source gas can be suppressed.

(d) Further, according to this embodiment, the ribbon heater (not shown), etc, is provided on the outer surface of the supply route of the liquid source from the tank 305 to the vaporizer 242, to thereby heat the liquid source to a prescribed temperature. Thus, vaporization of the liquid source in the vaporizer 242 can be accelerated.

(e) Moreover, according to this embodiment, for example as shown in FIG. 15, a cooling coil 300 is provided on the outer surface of the buffer tank 102, then chilling water and a thermal exchange medium such as industrial water, etc, is flown into the cooling coil 300, to thereby cool the buffer tank 102. Thus, temperature increase of the buffer tank due to thermal conduction can be suppressed, and decomposition of ozone in the buffer tank 102 can be suppressed before ozone reaches the processing chamber 201. Then, supply of the ozone gas into the processing chamber 201 can be stabilized and waste of ozone can be suppressed.

EXAMPLES

First, examples 1 to 3 of the present invention will be described together with comparative examples.

Figures 9, 10:
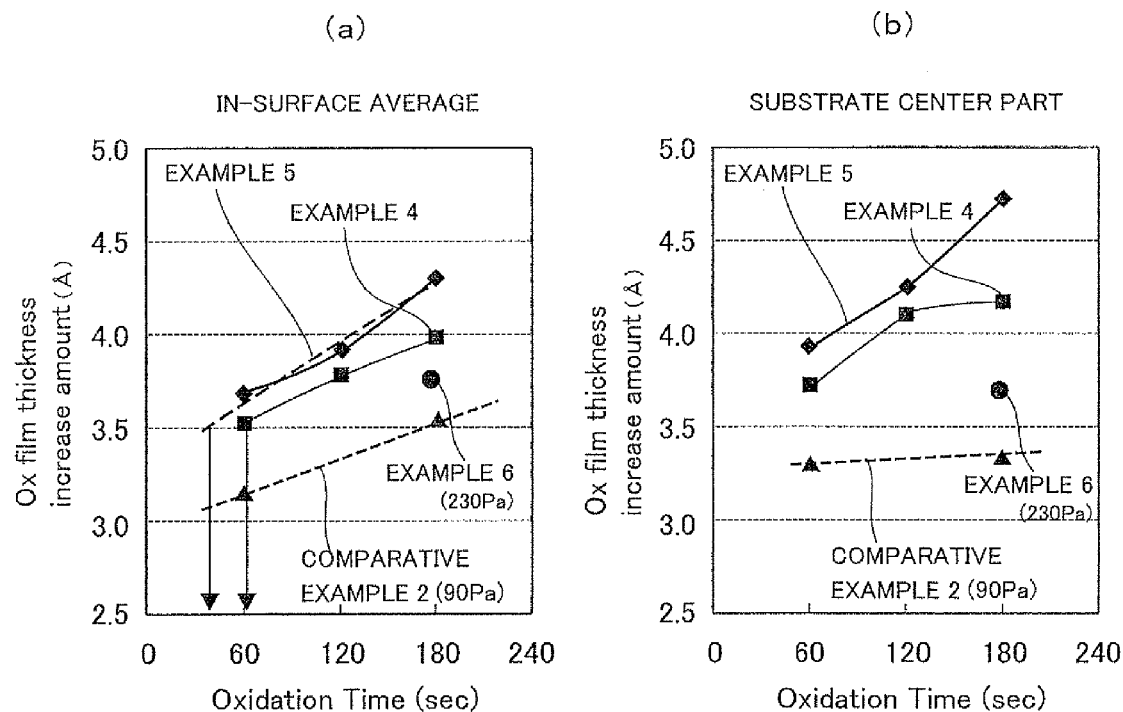
FIG. 9 is a table chart explaining examples 1 to 3 of the present invention together with a comparative example 1, showing an average oxide film thickness, a substrate center film thickness, and uniformity of film thickness.
FIG. 10 is a graph chart explaining examples 4 to 6 of the present invention together with a comparative example 2.
Figure 20:
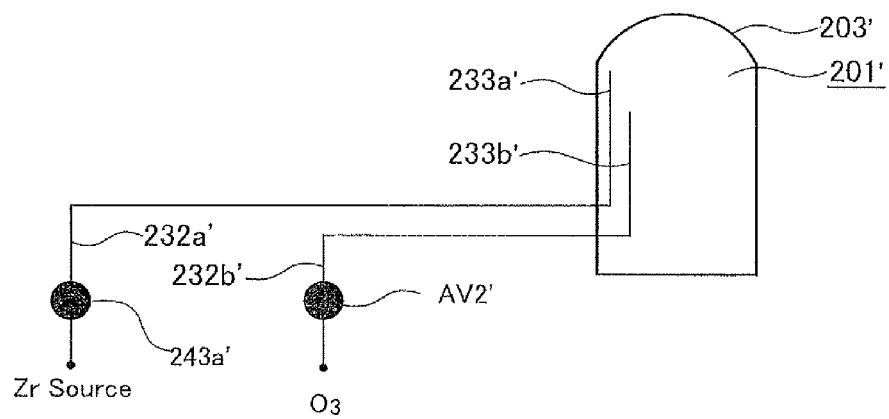
FIG. 20 is a schematic block diagram of a conventional vertical substrate processing apparatus.

FIG. 9 is a table chart explaining examples 1 to 3 of the present invention, together with comparative example 1, showing the film thickness of an average oxidation film, the film thickness of a substrate center part film, and uniformity of the film thickness.

Example 1

In this example, the sequence of the oxide film forming step (step 3) is the same as the aforementioned sequence example 1 (FIG. 6). Then, the time for reserving the ozone gas into the buffer tank 102 is set to be 3 seconds, the time for flowing the ozone gas into the processing chamber 201 from the buffer tank 102 is set to be 2 seconds, steps from the ozone reserving step (step 3a) to the ozone removing step (step 3c) are repeated 36 times, and the time for executing the oxide film forming step (step 3) is set to be 180 seconds in total. The flow rate of the $O_3$ adjusted by the first mass flow controller (MFC) 241a and supplied into the buffer tank 102 is set to be constant 9 slm.

Example 2

In this example, the sequence of the oxide film forming step (step 3) is the same as the aforementioned sequence example 2 (FIG. 7). Namely, in the ozone supplying step (step 3b), the fifth valve (exhaust valve) 243e is closed. The other conditions are the same as those of example 1.

Example 3

In this example, the sequence of the oxide film forming step (step 3) is the same as the aforementioned sequence example 3 (FIG. 8). Namely, in the ozone supplying step (step 3b), the opening degree of the fifth valve (exhaust valve) 243e is adjusted, and the pressure in the processing chamber 201 is adjusted to be an average pressure. The other conditions are the same as those of the example 1.

Comparative Example 1

In this comparative example, as shown in FIG. 5, the ozone gas is continuously supplied into the processing chamber 201, without reserving the ozone gas into the buffer tank 102. FIG. 5 is a sequence view of the oxide film forming step according to a comparative example. Namely, the valve AV1 and the valve AV2 are simultaneously opened, and the oxide film is formed without executing the ozone reserving step (step 3a) (without supplying the ozone gas pulsatively).

According to FIG. 9, in each case of the examples 1 and 2, the thickness of the $HfO_2$ film is larger than that of the comparative example 1, and this reveals that a high film forming speed can be obtained. Also, in each case of the examples 1, 2, 3, the thickness of the $HfO_2$ film is larger than that of the comparative example 1 in the center part of the wafer 200, and this reveals that the delay in oxidation of the base film in the center part of the wafer 200 can be suppressed. Also, in each case of the examples 1, 2, 3, it is found that the uniformity of the film thickness is improved, compared with the comparative example 1. In addition, in the examples 1, 2, it is found that the film forming speed is higher, the film thickness is larger in the center part of the wafer 200, and the uniformity of the film thickness is higher than those of example 3.

Next, examples 4 to 6 of the present invention will be described, together with a comparative example 2.

FIG. 10 is a graph chart explaining the examples 4 to 6 of the present invention together with the comparative example 2, wherein FIG. 10A shows a relation between an average film thickness increase amount of the oxide film in the surface of the substrate and an oxidation time, and FIG. 10B shows a relation between the film thickness increase amount of the oxide film in the center part of the substrate and the oxidation time, respectively.

Example 4

In this example, the sequence of the oxide film forming step (step 3) is the same as the aforementioned sequence example 1 (FIG. 6). Then, the number of repetitions from the ozone filing step (step 3a) to the ozone removing step (step 3c) is changed, to thereby change the execution time (oxidation time) of the oxide film forming step (step 3) in such a manner as 60 seconds, 120 seconds, and 180 seconds.

Example 5

In this example, the sequence of the oxide film forming step (step 3) is the same as the aforementioned sequence example 2 (FIG. 7). Namely, in the ozone supplying step (step 3b), the fifth valve (exhaust valve) 243e is closed. Then, the number of repetitions from the ozone reserving step (step 3a) to the ozone removing step (step 3c) is changed, to thereby change the execution time (oxidation time) of the oxide film forming step (step 3) in such a manner as 60 seconds, 120 seconds, and 180 seconds.

Example 6

In this example, the sequence of the oxide film forming step (step 3) is the same as the aforementioned sequence example 3 (FIG. 8). Namely, in the ozone supplying step (step 3b), the opening degree of the fifth valve (exhaust valve) 243e is adjusted, to thereby adjust the pressure of the processing chamber 201 to an average pressure (230 Pa). Then, the steps from the ozone reserving step (step 3a) to the ozone removing step (step 3c) are repeated, and the oxidation time is set to be 180 seconds.

Comparative Example 2

In this comparative example, as shown in FIG. 5, the ozone gas is not reserved into the buffer tank 102 but continuously supplied into the processing chamber 201. FIG. 5 is a sequence view of the oxide film forming step according to the comparative example. Namely, the valve AV1 and the valve AV2 are simultaneously opened, to thereby form the $HfO_2$ film without executing the ozone reserving step (step 3a) (without supplying the ozone gas pulsatively). The valve AV1 and the valve AV2 are simultaneously opened, to thereby change the time (oxidation time) for supplying the ozone gas in such a manner as 60 seconds, 120 seconds, and 180 seconds.

According to FIG. 10A, in a case of the comparative example 2, it is found that the oxidation time of about 180 seconds is required for increasing the average film thickness of the $HfO_2$ film by 3.5 Å. Meanwhile, in each case of the examples 4, 5, 6 also, it is found that a short oxidation time is enough to increase the average film thickness of the $HfO_2$ film by 3.5 Å. For example, it is found that the oxidation time of about 60 seconds is enough in a case of the example 4, to increase the average film thickness of the $HfO_2$ film by 3.5 Å, and in a case of the example 5, the oxidation time of about 40 seconds is enough. Namely, in each case of the examples 4 to 6, it is found that a higher film forming speed can be obtained, compared with the comparative example 2.

Further, according to FIG. 10B, in a case of the comparative example 2, even if the oxidation time is increased from 60 seconds to 180 seconds, the thickness of the oxide film in the center part of the substrate is hardly increased (0.1 to 0.2 Å). Meanwhile, in examples 4 and 5, it is found that the thickness of the $HfO_2$ film in the center part of the wafer 200 is relatively largely increased (1 to 2 Å), by increasing the oxidation time from 60 seconds to 180 seconds. Namely, in each case of the examples 4 and 5 also, the delay of the oxidation of the base film in the center part of the wafer 200 can be suppressed.

Next, examples 7 and 8 of the present invention will be described together with the comparative example 3.

FIG. 11 is a table chart describing examples 7 and 8 of the present invention together with the comparative example 3, and showing the average thickness of the $HfO_2$ film and the uniformity of the film thickness, in each case of an upper part and a lower part of substrate processing positions.

Example 7

In this example, the sequence of the oxide film forming step (step 3) is the same as the aforementioned sequence example 2 (FIG. 7). Namely, in the ozone supplying step (step 3b), the fifth valve (exhaust valve) 243e is closed. Then, by an ALD method wherein the steps from the source gas supplying step (step 1) to the oxide film forming step (step 3) are set as one cycle, and this cycle is repeated multiple number of times, the $HfO_2$ film of a prescribed thickness is formed on the substrate.

Example 8

In this example, the sequence of the oxide film forming step (step 3) is the same as the aforementioned sequence example 3 (FIG. 8). Namely, in the ozone supplying step (step 3b), the opening degree of the fifth valve (exhaust valve) 243e is adjusted, to thereby adjust the pressure in the processing chamber 201 to an average pressure. Then, by the ALD method wherein the steps from the source gas supplying step (step 1) to the oxide film forming step (step 3) are set as one cycle, and this cycle is repeated multiple number of times, the $HfO_2$ film of a prescribed thickness is formed on the substrate.

Comparative Example 3

In this comparative example, as shown in FIG. 5, the ozone gas is continuously supplied into the processing chamber 201, without filing the ozone gas into the buffer tank 102. FIG. 5 is a sequence view of the oxide film forming step according to the comparative example. Namely, the valve AV1 and the valve AV2 are simultaneously opened, and the $HfO_2$ film is formed by the ALD method, without executing the ozone filing step (step 3a) (without supplying the ozone gas pulsatively).

According to FIG. 11, in each case of the examples 7 and 8 also, it is found that the uniformity of the film thickness is improved, compared with the comparative example 3. Note that the film thickness of the examples 7 and 8, and the film thickness of the comparative example 3 are different from each other. However this is because the number of cycles of ALD is smaller than the number of cycles of ALD of the comparative example 3, and this is not because the film forming speed of the examples 7 and 8 is lower than the film forming speed of the comparative example 3.

Next, examples 9 and 10 of the present invention will be described, together with the comparative example 4.

FIG. 12 is a table chart showing the composition uniformity of the $HfO_2$ film in each of the upper part, middle part, and lower part of the substrate processing positions, wherein FIG. 12A shows the composition uniformity of the comparative example 4, FIG. 12B shows the composition uniformity of the example 9, and FIG. 13C shows the composition uniformity of the example 10, respectively. Note that in any one of the cases, evaluation of the composition uniformity is performed by XPS.

Example 9

In this example, the sequence of the oxide film forming step (step 3) is the same as the aforementioned sequence example 2 (FIG. 7). Namely, in the ozone supplying step (step 3b), the fifth valve (exhaust valve) 243e is closed. Then, by the ALD method wherein the steps from the source gas supplying step (step 1) to the oxide film forming step (step 3) are set as one cycle, the $HfO_2$ film of a prescribed thickness is formed on the substrate.

Example 10

In this example, the sequence of the oxide film forming step (step 3) is the same as the aforementioned sequence example 3 (FIG. 8). Namely, in the ozone supplying step (step 3b), the opening degree of the fifth valve (exhaust valve) 243e is adjusted, to thereby adjust the pressure in the processing chamber 201 to an average pressure. Then, by the ALD method wherein the steps from the source gas supplying step (step 1) to the oxide film forming step (step 3) are set as one cycle, the $HfO_2$ film of a prescribed thickness is formed on the substrate.

Comparative Example 4

In this comparative example, the ozone gas is continuously supplied into the processing chamber 201, without filing the ozone gas into the buffer tank 102. Namely, the valve AV1 and the valve AV2 are simultaneously opened, and the HfO$_2$ film is formed by the ALD method, without executing the ozone reserving step (step 3a) (without supplying the ozone gas pulsatively).

According to FIG. 12, in a case of the comparative example 4, it is found that the composition uniformity is deteriorated (deteriorated from ±1.40% to ±3.00%), toward the upper part from the lower part of the substrate processing positions. Namely, in the case of the comparative example 4, it is found that the ozone supply amount to the center part of the wafer is decreased toward the upper part from the lower part of the substrate processing positions. Meanwhile, in each case of the examples 9 and 10, high composition uniformity can be obtained even if the substrate processing positions are changed (±0.9 to ±1.0% in the case of the example 9, and ±1.25% in the case of the example 10). Namely, in either case of the examples 9 and 10, it is found that the ozone supply amount to the center part of the wafer can be prevented from being decreased toward the upper part from the lower part of the substrate processing positions.

Fourth Embodiment

Next, the structure of the substrate processing apparatus according to a fourth embodiment of the present invention, and a substrate processing step executed by this substrate processing apparatus will be described.

(1) Structure of the Substrate Processing Apparatus

Figure 13:
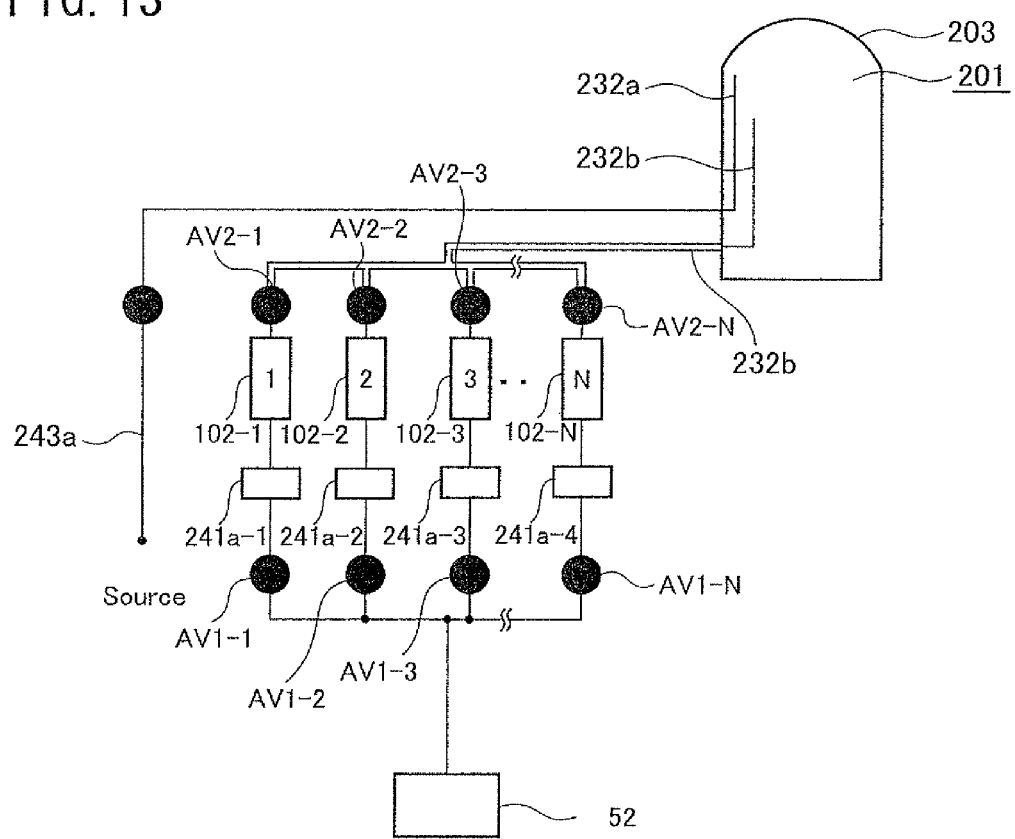
FIG. 13 is a schematic block diagram of a processing furnace and a gas supply unit of the substrate processing apparatus according to a fourth embodiment of the present invention.

First, the structure of the substrate processing apparatus according to this embodiment will be described, with reference to FIG. 13. FIG. 13 is a schematic block diagram of a processing furnace and a gas supply unit of the substrate processing apparatus according to this embodiment. In this embodiment, the gas supply unit includes a plurality of ozone gas supply routes from the ozonizer 52 to the second gas supply nozzle 233b, and these plurality of ozone gas supply routes are provided in parallel. This point is a different point from the third embodiment. Note that other structure is the same as the structure of the third embodiment excluding an oxidation sequence of the controller 280. The structure of the gas supply unit according to this embodiment will be described hereinafter.

As shown in FIG. 13, the lower stream end of the second gas supply tube 232b is connected to the upper stream end of the second gas supply nozzle 233b. The second gas supply tube 232b is branched into a plurality of branch lines (N lines in FIG. 13) in parallel, in the vicinity of a midstream. Each branch line thus branched is merged and unified again on the upper stream side and is connected to the ozonizer 52. Ozone inlet valves AV1-1 to AV1-N, first mass flow controllers 241a-1 to 241a-N, buffer tanks 102-1 to 102-N, being the gas reservoir connected to the processing chamber 201, and ozone supply valves AV2-1 to AV2-N are respectively provided sequentially from the upper stream side, in each branch line formed by branching the second gas supply tube 232b.

By closing the ozone supply valves AV2-1 to AV2-N, and opening the ozone inlet valves AV1-1 to AV1-N, the ozone gas can be reserved into the buffer tanks 102-1 to 102-N, while adjusting the flow rate by the first mass flow controllers 241a-1 to 241a-N. Thereafter, by sequentially opening the ozone supply valves AV2-1 to AV2-N, the ozone gas reserved into the buffer tanks 102-1 to 102-N can be supplied (flush-supplied) into the processing chamber 201 pulsatively. Further, by controlling a time interval for opening the ozone supply valves AV2-1 to AV2-N, the time interval for pulse-supply is narrowed, so that an oxidation processing speed can be increased.

(2) Substrate Processing Step

Next, the substrate processing step according to this embodiment executed as one of the manufacturing steps of the semiconductor device will be described, with reference to FIG. 14. FIG. 14 is a view exemplifying an operation of the gas supply unit according to this embodiment, and a valve open/close sequence. According to the substrate processing step of this embodiment, in the oxide film forming step (step 3), the ozone gas, being the oxide gas, is sequentially supplied (flush-supplied) into the processing chamber 201 pulsatively, from a plurality of ozone supply routes provided in parallel. This point is a different point from the third embodiment. The substrate processing step according to this embodiment is executed by the substrate processing apparatus shown in FIG. 13. In the following description, the operation of each part constituting the substrate processing apparatus is controlled by the controller 280.

(Wafer Loading Step to Source Gas Removing Step (Step 2))

First, in the same way as the aforementioned embodiments, the wafer loading step, the source gas supplying step (step 1), and the source gas removing step (step 2) are sequentially executed.

(Oxide Film Forming Step (Step 3))

Next, the oxide film forming step (step 3) is executed. Note that in the oxide film forming step (step 3) exemplified in FIG. 14, by using an ozone supply system of three systems, the ozone gas is sequentially supplied (flush-supplied) into the processing chamber 201 pulsatively.

First, as shown in [1] of FIG. 14, the ozone supply valves AV2-1 to AV2-3, and the ozone inlet valves AV1-2, AV1-3 are closed, then the ozone inlet valve AV1-1 is opened, and the ozone gas is reserved into the buffer tank 102-1 while adjusting the flow rate by the first mass flow controller 241a-1 (ozone filing step (step 3a-1)).

When a prescribed amount of ozone gas is reserved into the buffer tank 102-1 after elapse of a prescribed time, and the pressure in the buffer tank 102-1 reaches. For example, 100000 Pa, as shown in [2] of FIG. 14, the ozone inlet valve AV1-1 is closed and the ozone supply valve AV2-1 is opened, and the ozone gas reserved into the buffer tank 102-1 is supplied into the processing chamber 201 (ozone supplying step (step 3b-1)). In the ozone supplying step (step 3b-1), the ozone gas reserved into the buffer tank 102-1 is supplied (flush-supplied) into the processing chamber 201 pulsatively. The ozone gas causes surface reaction with TEMAH which is chemically adsorbed on the surface of the wafer 200, to thereby form the HfO$_2$ film on the wafer 200. In addition, in the ozone supplying step (step 3b-1), the pressure in the processing chamber 201 immediately after supplying ozone is set to be, for example, in a range of 0.1 to 1000 Pa.

Also, as shown in [2] of FIG. 14, in parallel to execution of the ozone supplying step (step 3b-1), the ozone inlet valve AV1-2 is opened, and the ozone gas is reserved into the buffer tank 102-2, while adjusting the flow rate by the first mass flow controller 241a-2 (ozone reserving step (step 3a-2).

When a prescribed amount of ozone gas is reserved into the buffer tank 102-2 after elapse of a prescribed time, and the pressure in the buffer tank 102-2 reaches, for example, 100000 Pa, as shown in [3] of FIG. 14, the ozone inlet valve AV1-2 is closed, and the ozone supply valve AV2-2 is opened, and the ozone gas reserved into the buffer tank 102-2 is supplied into the processing chamber 201 (ozone supplying step (step 3b-2)). In the ozone supplying step (step 3b-2), the ozone gas reserved into the buffer tank 102-2 is supplied (flush-supplied) into the processing chamber 201 pulsatively. The ozone gas is chemically adsorbed on the surface of the wafer 200, to cause surface reaction with TEMAH, and the $HfO_2$ film is formed on the wafer 200. Note that in the ozone supplying step (step 3b-2), the pressure in the processing chamber 201 immediately after supplying ozone is set, for example, within a range of 0.1 to 1000 Pa.

Further, as shown in [3] of FIG. 14, in parallel to execution of the ozone supplying step (step 3b-2), the ozone inlet valve AV1-3 is opened, and the ozone gas is reserved into the buffer tank 102-3, while adjusting the flow rate by the first mass flow controller 241a-3 (ozone reserving step (step 3a-3)).

When a prescribed amount of ozone gas is reserved into the buffer tank 102-3 after elapse of a prescribed time, and the pressure in the buffer tank 102-3 reaches, for example, 100000 Pa, as shown in [4] of FIG. 14, the ozone inlet valve AV1-3 is closed and the ozone supply valve AV2-3 is opened, and the ozone gas reserved into the buffer tank 102-3 is supplied (flush-supplied) into the processing chamber 201 pulsatively. The ozone gas causes surface reaction with TEMAH which is chemically adsorbed on the surface of the wafer 200, to thereby form the $HfO_2$ film on the wafer 200. In addition, in the ozone supplying step (step 3b-3), the pressure in the processing chamber 201 immediately after supplying ozone is set, for example, within a range of 0.1 to 1000 Pa.

Further, as shown in [4] of FIG. 14, in parallel to execution of the ozone supplying step (step 3b-3), the ozone inlet valve AV1-1 is opened, and the ozone gas is reserved into the buffer tank 102-1, while adjusting the flow rate of the first mass flow controller 241a-3 (ozone reserving step (step 3a-1)).

Thereafter, the steps from the ozone reserving step (step 3a-1) to the ozone supplying step (step 3b-3) are set as one cycle, and after repeating this cycle multiple number of times, the ozone supplying valves AV2-1 to AV2-3 are closed, to thereby end the oxide film forming step (step 3). In addition, during executing and after ending the oxide film forming step (step 3), the fifth valve 243e of the exhaust tube 231 is always opened, to thereby exhaust the inside of the processing chamber 201 by the vacuum pump 246, so that the residual ozone and intermediate body of ozone are removed from the processing chamber 201. In addition, it is also acceptable that the opening degree of the fifth valve 243e is adjusted and the pressure in the processing chamber 201 is adjusted. Note that when $N_2$ being purge gas, is supplied into the processing chamber 201 until the removal of the residual ozone and intermediate body of ozone from the processing chamber 201 is completed, the effect of excluding the residual ozone and intermediate body of ozone from the processing chamber 201 is further increased.

(Repeating Step)

Thereafter, the steps from the source gas supplying step (step 1) to the oxide film forming step (step 3) are set as one cycle, and by repeating this cycle multiple number of times, the $HfO_2$ film of a prescribed thickness is formed on the wafer 200, and the substrate processing step according to this embodiment is ended. Then, the wafer 200 after processing is unloaded from the processing chamber 201, by a procedure reverse to the wafer loading step.

Note that in this embodiment, the number of supply routes of the ozone gas (the number of buffer tanks 102-1 to 102N)

provided in parallel is decided based on a balance between a processing time and a manufacturing cost required for forming the oxide film.

(3) Effect of this Embodiment

According to this embodiment, one or a plurality of effects shown below are further exhibited, in addition to the aforementioned effects.

(a) According to this embodiment, the time interval of the pulse-supply is narrowed by controlling the time interval for opening the ozone supply valves AV2-1 to AV2-N, to thereby increase the speed of the oxidation processing and it becomes possible to improve the throughput (productivity) of processing substrates.

(b) Further, according to this embodiment, waste of ozone discharged from a vent line is reduced. Therefore, the service life of the ozonizer 52 can be prolonged, and a running cost can be reduced.

Other Embodiment of the Present Invention

As described above, embodiments of the present invention are specifically described. However, the present invention is not limited to the aforementioned embodiments, and can be variously modified in a range not beyond its gist.

For example, the present invention can be applied to a case of forming films, such as a film other than the $HfO_x$ film (Si oxide film (SiO), Hf oxide film (HfOx), Zr oxide film (ZrO), Al oxide film, Ti oxide film, Ta oxide film, Ru oxide film, and Ir oxide film).

As the source gas, it is possible to use not only the TEMAH gas obtained by vaporizing tetrakisethylmethyl amino hafnium (TEHAH), being the liquid source which is a liquid at a room temperature, but also the gas obtained by vaporizing other organic metal liquid source such as tetrakisethylmethyl amino zirconium. Also, as the oxide gas, it is possible to use not only ozone ($O_3$), but also other oxygen-containing gas.

Also, as the source gas supplied into the processing chamber 201, it is possible to use the gas, being a vapor at a room temperature, other than the gas obtained by vaporizing the source, being the liquid at a room temperature by the vaporizer 242, depending on the kind of the thin film formed on the wafer 200. In such a case, it is also acceptable that the source gas supply source and the mass flow controller (both of them are not shown) are provided, instead of the liquid source supply source, the liquid mass flow controller 240, and the vaporizer 242. It is also acceptable that the second carrier gas supply tube 234b is removed, depending on the kind and concentration of the oxide gas supplied into the processing chamber 201.

Figure 17:
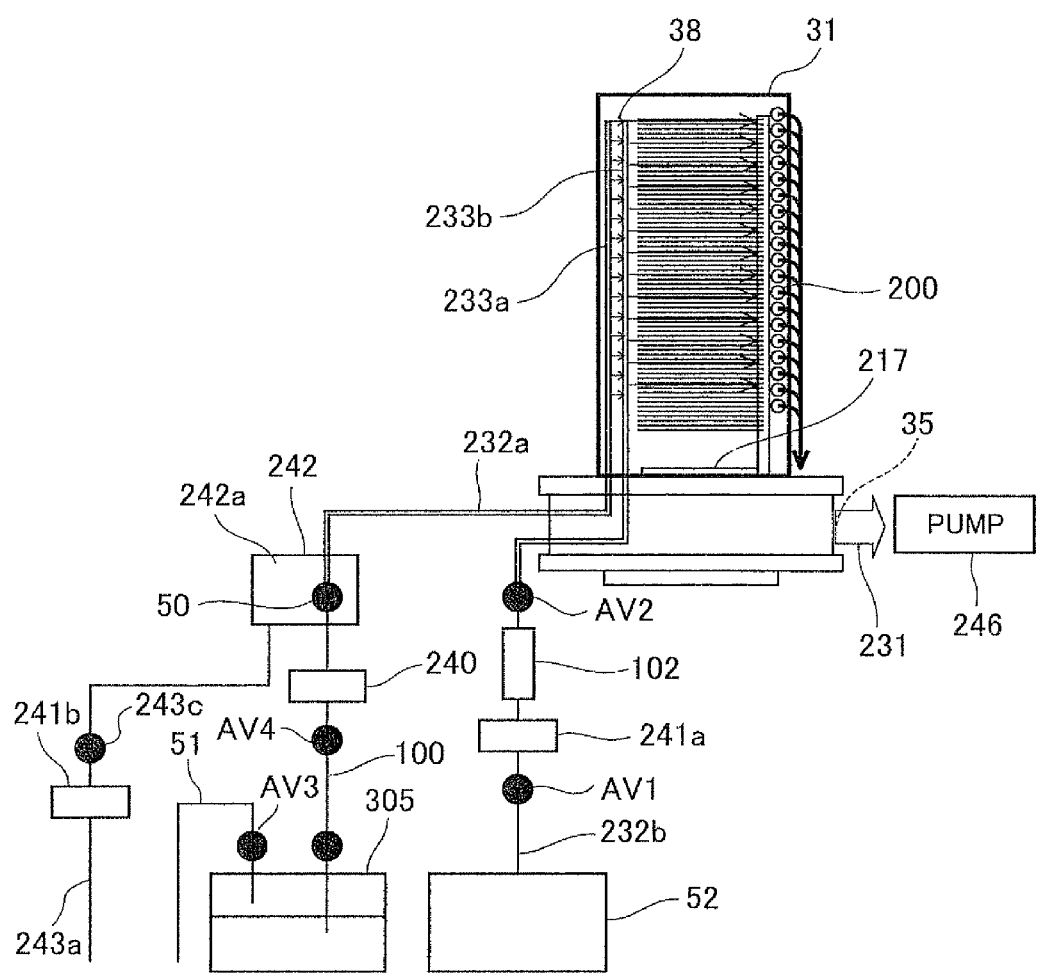
FIG. 17 is a schematic block diagram when the gas supply unit according to the third embodiment is applied to a side flow-type vertical substrate processing apparatus.

Also, third and fourth embodiments show a case in which the substrate processing apparatus is constituted as a normal flow type vertical substrate processing apparatus. However, the substrate processing apparatus is not limited thereto, and may be constituted as a side flow type vertical substrate processing apparatus. FIG. 17 is a schematic block diagram in a case that the gas supply unit according to the third embodiment is applied to the side flow type vertical substrate processing apparatus.

Preferred Aspects of the Present Invention

Next, preferred aspects of the present invention will be additionally described.

(Additional Description 1)

There is provided a substrate processing method, including the steps of:

supplying source gas into a processing chamber in which substrates are accommodated;

removing the source gas and an intermediate body of the source gas remained in the processing chamber;

supplying ozone into the processing chamber in a sate of substantially stopping an exhaust of an atmosphere in the processing chamber;

removing ozone and the intermediate body of the ozone remained in the processing chamber;

with these steps repeated multiple number of times, to thereby alternately supply the source gas and the ozone so as not to be mixed with each other, and form an oxide film on the surface of the substrate.

Preferably, the source gas is a liquid source at a room temperature and under an atmospheric pressure, and in the source gas supplying step, the source gas is supplied into the processing chamber while exhausting the atmosphere in the processing chamber.

Further preferably, in the ozone supplying step, a pressure in the processing chamber immediately after supplying the ozone is 0.1 to 1000 Pa.

Further preferably, in the ozone supplying step, the ozone is supplied into the processing chamber while adjusting the pressure in the processing chamber to an average pressure.

Further preferably, an ozone filing step for filing the ozone into a gas reservoir connected to the processing chamber is provided before the ozone supplying step, and in the ozone supplying step, the ozone reserved into the gas reservoir is supplied into the processing chamber.

Further preferably, the ozone reserving step is performed simultaneously with the source gas supplying step and/or the source gas removing step. Namely, the ozone reserving step is performed simultaneously with the source gas supplying step, simultaneously with the source gas removing step, or simultaneously with the source gas supplying step and the source gas removing step.

Further preferably, in the ozone reserving step, the ozone is reserved into the gas reservoir, until the pressure in the gas reservoir becomes 100000 Pa.

Further preferably, in each of the steps, the gas supply tube connecting the gas reservoir and the processing chamber is heated to a second temperature, while heating the substrate to a first temperature and further while cooling the gas reservoir to a third temperature, wherein the first temperature is set higher than the second temperature, and the second temperature is set higher than the third temperature.
(Additional Description 2)

There is provided the substrate processing method, including the steps of:

supplying source gas into a processing chamber in which substrates are accommodated;

exhausting an atmosphere in the processing chamber;

reserving ozone into a gas reservoir connected to the processing chamber;

supplying into the processing chamber the ozone reserved into the gas reservoir; and exhausting the atmosphere in the processing chamber;

with these steps repeated multiple number of times, to thereby alternately supply the source gas and the ozone so as not to be mixed with each other, and form an oxide film on the surface of the substrate.
(Additional Description 3)

There is provided a substrate processing method, including the steps of:

loading substrates into a processing chamber;

supplying ozone into the processing chamber, in a state of substantially stopping exhaust of an atmosphere in the processing chamber; and removing the ozone and an intermediate body of the ozone remained in the processing chamber, with these ozone supplying step and ozone removing step repeated multiple number of times, to thereby form an oxide film on the surface of the substrate.

Preferably, in the ozone supplying step, the pressure in the processing chamber immediately after supplying the ozone is 0.1 to 1000 Pa.

Further preferably, in the ozone supplying step, the ozone is supplied into the processing chamber while adjusting the pressure in the processing chamber to an average pressure.

Further preferably, the ozone reserving step for reserving the ozone into a gas reservoir connected to the processing chamber is provided before the ozone supplying step, and in the ozone supplying step, the ozone reserved into the gas reservoir is supplied into the processing chamber.

Further preferably, in the ozone reserving step, the ozone if reserved into the gas reservoir, until the pressure in the gas reservoir becomes 100000 Pa.

Further preferably, in each of the steps, the gas supply tube connecting the gas reservoir and the processing chamber is heated to a second temperature while heating the substrate to a first temperature and further while cooling the gas reservoir to a third temperature, wherein the first temperature is set higher than the second temperature, and the second temperature is set higher than the third temperature.
(Additional Description 4)

There is provided a substrate processing method, including the steps of:

reserving ozone into a gas reservoir connected to a processing chamber in which substrates are accommodated;

supplying into the processing chamber the ozone reserved into the gas reservoir; and exhausting an atmosphere in the processing chamber;

with these steps repeated multiple number of times, to thereby form an oxide film on the surface of the substrate.
(Additional Description 5)

There is provided a substrate processing apparatus, including:

a processing chamber processing a substrate;

a gas supply unit supplying ozone into the processing chamber;

an exhaust unit exhausting an atmosphere in the processing chamber; and a controller, with the gas supply unit including an ozone supply path connected to the processing chamber, and an ozone supply valve performing open/close of the ozone supply path.

with the exhaust unit including an exhaust path connected to the processing chamber, and an exhaust valve for opening and closing the exhaust path, with the controller controlling the gas supply unit and the exhaust unit so that the ozone is supplied into the processing chamber from the ozone supply path in a state of substantially stopping an exhaust of the atmosphere inside of the processing chamber, when the ozone is supplied into the processing chamber.

Preferably, the gas supply unit is disposed on the upper stream side of the ozone supply valve and has a gas reservoir for accumulating ozone, and the controller controls the gas supply unit so as to supply the ozone accumulated in the gas reservoir into the processing chamber by opening the ozone supply valve, after the ozone is supplied into the ozone supply path and the ozone is accumulated in the gas reservoir.

Further preferably, a volume ratio of the gas reservoir to a volume of the processing chamber is 1/2100 to 1/105.

Further preferably, the gas supply unit includes a cooling unit having a cooling medium that cools the gas reservoir.

Further preferably, an inner wall of the gas reservoir is coated with any one of a Fe oxide film, a Ti oxide film, an Al oxide film, a Ni oxide film, and a Cr oxide film.

(Additional Description 6)

There is provided a substrate processing apparatus, including:

a processing chamber that accommodates a substrate;

a heating unit disposed outside the processing chamber, for heating an atmosphere and the substrate in the processing chamber;

a gas supply unit that supplies a prescribed gas to the processing chamber;

an exhaust unit that exhausts the atmosphere in the processing chamber; and a controller that controls at least gas supply operation in the gas supply unit or gas exhaust operation in the exhaust unit, with the gas supply unit having an ozone supply part for supplying ozone into the processing chamber, with the ozone supply part having an ozone supply path, a gas reservoir for accumulating ozone, disposed on the ozone supply path on an upper stream side of a connection part of the ozone supply path and the processing chamber, and an ozone supply valve for opening and closing the ozone supply path, disposed on the ozone supply path, being the connection part between the gas reservoir and the processing chamber, wherein the controller controls the gas supply unit in such manner that, when ozone is supplied into the processing chamber, first, the ozone supply valve is closed, then ozone is flown to the ozone supply path, and a prescribed amount of ozone is accumulated in the gas reservoir, then the ozone supply valve is opened and ozone accumulated in the gas reservoir is supplied to the processing chamber, to thereby form a desired oxide film on the substrate. The pressure in the processing chamber is more reduced than an atmospheric pressure, and an ozone supply accumulating pressure is higher than the pressure in the processing chamber, and substrates are horizontally disposed in the processing chamber in multiple stages. In this state, when the ozone supply valve is opened, ozone is supplied along an upper surface of each substrate pulsatively, and the substrate is processed uniformly in the surface by ozone.

Preferably, there is provided the substrate processing apparatus, wherein the controller controls the gas supply unit, so that a first step of flowing the ozone to the ozone supply path and accumulating a prescribed amount of the ozone in the gas reservoir, and a second step of opening the ozone supply valve and supplying into the processing chamber the ozone accumulated in the gas reservoir are repeated prescribed number of times, when the ozone is supplied into the processing the chamber, to thereby form a desired oxide film on the substrate. Thus, ozone is continuously supplied to the substrate pulsatively. As a result, the substrate is processed uniformly in the surface.

Further preferably, there is provided the substrate processing apparatus, wherein the exhaust unit has an exhaust path; a vacuum exhaust part connected through the exhaust path; and an exhaust valve for opening/closing the exhaust path, with the controller controlling the gas supply unit and the exhaust unit so that the ozone accumulated in the gas reservoir is supplied into the processing chamber from the gas reservoir in a state of stopping exhaust of the processing chamber or extremely squeezing the exhaust of the processing chamber, to thereby form a desired oxide film on the substrate. When the exhaust is stopped or squeezed at the time of oxidizing the substrate by ozone, the substrate is processed uniformly in the surface.

Further preferably, there is provided the substrate processing apparatus, wherein the pressure in the processing chamber immediately after supplying the ozone is set to be 0.1 to 1000 Pa. In a case of the pressure of under 0.1 Pa, uniformity in the surface of the oxide film is lowered, and when the pressure exceeds 1000 Pa, the thickness of the oxide film does not become uniform in the surface. Accordingly, when the oxide film is formed, the pressure in the processing chamber immediately after supplying ozone is set to be 0.1 to 1000 Pa.

Further preferably, there is provided the substrate processing apparatus, wherein the ozone is accumulated in the gas reservoir, until the pressure in the gas reservoir reaches 100000 Pa. When the pressure of the gas reservoir is set to the aforementioned pressure, uniform oxidation and film-formation in the surface of the substrate is possible by ozone supplied to the substrate pulsatively, when the ozone supply valve is opened.

Further preferably, there is provided the substrate processing apparatus, wherein a volume ratio of the gas reservoir to a volume of the processing chamber is 1/2100 to 1/105. Thus, by deciding the volume ratio, the wafer can be uniformly oxidized in the surface and uniform film-formation in the surface is possible.

Further preferably, there is provided the substrate processing apparatus, wherein the controller controls the gas supply unit and the exhaust unit so as to adjust the pressure in the processing chamber to an average pressure when the ozone is supplied into the processing chamber, to thereby form a desired oxide film. Here, the average pressure is the pressure obtained from the pressure for supplying ozone without closing the exhaust valve. When the pressure in the processing chamber is set to be the average pressure, a desired oxide film can be formed uniformly in the surface of the substrate.

Further preferably, there is provided the substrate processing apparatus, wherein the exhaust unit is connected to a lower part of the processing chamber. When the exhaust unit is provided in the lower part, source gas (processing gas) can be exhausted after flowing through the processing chamber, and therefore there is no waste of source gas (processing gas). Moreover, the exhaust unit in the lower part is suitable for forming the flow suitable for oxidation and film-formation without disturbing the flow of the gas in the processing chamber.

Further preferably, there is provided the substrate processing apparatus, wherein the processing chamber includes an outer tube and an inner tube set inside of the outer tube, with at least its lower end opened, in which the plurality of substrates are laminated and accommodated, and the gas supply unit has a plurality of gas supply nozzles having gas jet holes erected inside of the inner tube so as to be extended in a laminating direction of the plurality of substrates, and further the processing chamber has a plurality of exhaust ports provided in the inner tube, at positions opposed to the gas supply nozzles.

When the processing chamber is thus constructed, a horizontal flow can be formed on each substrate, and therefore in-surface uniformity of each substrate can be improved. Moreover, both of the processing gas after passing through a gap between the inner tube and the outer tube, and the processing gas from an open end of the inner tube can be exhausted. Therefore, substitution efficiency of the gas can be improved.

Further preferably, there is provided the substrate processing apparatus, wherein the ozone supply part includes a cooling unit having a cooling medium for cooling the gas reservoir.

When this gas reservoir is cooled, the service life of ozone is prolonged, and therefore the substrate can be processed in a state of a constant quality.

Further preferably, there is provided the substrate processing apparatus, wherein the cooling medium is either one of the cooling water and a peltier element. With a simple structure, accumulation of the supplied ozone can be surely cooled, and therefore reliability is improved.

Further preferably, there is provided the substrate processing apparatus, wherein an inner wall of the gas reservoir is coated with any one of a Fe oxide film, a Ti oxide film, an Al oxide film, a Ni oxide film, and a Cr oxide film. Thus, reaction between ozone and cooled reservoir is prevented, and therefore reliability of processing substrates can be improved.

Further preferably, there is provided the substrate processing apparatus, wherein the gas supply unit has a source gas supply part that supplies source gas different from ozone into the processing chamber, and the source gas supply part has a source gas supply path and a source gas supply valve disposed in the source gas supply path, for opening and closing the source gas supply path, and the controller controls the gas supply unit and the exhaust unit so that the source gas and the ozone are alternately repeatedly supplied into the processing chamber multiple number of times so as not to be mixed with each other, and when the source gas is supplied into the processing chamber, the source gas is supplied into the processing chamber from the source gas supply path, and in a state of closing the ozone supply valve, the ozone is flown to thsand a prescribed amount of the ozone is accumulated in the gas reservoir, to thereby form a desired oxide film on the substrate.

With this structure, ozone can be accumulated in the gas reservoir while processing the substrate by the source gas. Ozone is supplied to the substrate by opening the ozone supply valve, immediately after ending the processing by the source gas, and the ozone causes reaction with raw materials of the source gas, to thereby oxidize the substrate or form a film thereon.

Further preferably, there is provided the substrate processing apparatus, wherein the oxide film is any one of the Si oxide film, Hf oxide film, Zr oxide film, Al oxide film, Ti oxide film, Ta oxide film, Ru oxide film, and Ir oxide film.

Further preferably, the source gas is any one of an organic compound containing Si atom, Hf atom, Zr atom, Al atom, Ti atom, Ta atom, Ru atom, and Ir atom or chloride of the aforementioned atoms.

Further preferably, there is provided the substrate processing apparatus, wherein the controller further controls the gas supply unit and the exhaust unit so that the remained source gas or ozone is removed, after supply of the source gas into the processing chamber is stopped and after supply of the ozone into the processing chamber is stopped.

Thus, the processing chamber is cleaned.
(Additional Description 7)

There is provided a manufacturing method of a semiconductor device, including:

a first step of reserving ozone into a gas reservoir connected to a processing chamber;

a second step of supplying into the processing chamber ozone reserved into the gas reservoir; and a third step of exhausting an atmosphere in the processing chamber, with the steps from the first step to the third step repeatedly performed one or more times, to thereby form an oxide film of a prescribed thickness on the surface of a plurality of substrates laminated and accommodated in the processing chamber.

By these steps, the substrate can be processed uniformly in the surface and the oxide film can be formed.

Preferably, there is provided the manufacturing method of the semiconductor device, wherein when the steps from the first step to the third step are repeated, at least one or more first step and third step are simultaneously performed. When ozone is exhausted while being supplied pulsatively, the oxide film can be uniformly formed in the surface.
(Additional Description 8)

There is provided the manufacturing method of the semiconductor device for forming the oxide film of a prescribed thickness on the surface of a plurality of substrates laminated and accommodated in a processing chamber by supplying source gas and ozone into the processing chamber alternately and repeatedly prescribed number of times so as not to be mixed with each other, including:

a first step of supplying the source gas into the processing chamber;

a second step of reserving the ozone into a gas reservoir connected to the processing chamber;

a third step of supplying into the processing chamber ozone reserved into the gas reservoir; and a fourth step of exhausting an atmosphere in the processing chamber, with the steps from the first step to the fourth step repeated at least one or more times, to thereby form an oxide film of a prescribed thickness on the surface of a plurality of substrates laminated and accommodated in the processing chamber. When these steps are executed, a desired film can be uniformly formed in the surface of the substrate.

Preferably, there is provided the manufacturing method of the semiconductor device, wherein when the steps from the first step to the fourth step are repeated, at least one or more first step and second step are simultaneously performed. With this structure, ozone can be accumulated in the gas reservoir while processing the substrates by the source gas. Ozone is supplied to the substrate, by opening the ozone supply valve immediately after processing by the source gas is ended, and the ozone causes reaction with raw materials of the source gas, to thereby perform oxidation and film-formation.

What is claimed is:

1. A method of manufacturing a semiconductor device, comprising:

forming an oxide film on a surface of a substrate by alternately supplying a source gas and an ozone gas so as not to be mixed with each other by setting (a)-(e) as one cycle and repeating the cycle multiple times:

(a) supplying the source gas into a processing chamber in which the substrate is accommodated;

(b) first-exhausting an atmosphere in the processing chamber;

(c) reserving the ozone gas into a gas reservoir connected to the processing chamber, with a volume ratio of 1/2100 to 1/105 to the processing chamber, by supplying the ozone gas into the gas reservoir;

(d) flush-supplying the ozone gas reserved in the gas reservoir into the processing chamber in a state of substantially stopping exhaust of an atmosphere in the processing chamber while maintaining the supply of the ozone gas into the gas reservoir and so that the within a range of 0.1 to 1000 Pa, after a prescribed amount of the ozone gas is reserved in the gas reservoir; and (e) second-exhausting an atmosphere in the processing chamber.

2. The method of manufacturing a semiconductor device according to claim 1, wherein at least a part of the first-exhaust and the reserve of the ozone gas are performed simultaneously.

3. The method of manufacturing a semiconductor device according to claim 1, wherein in the supply of the ozone gas, the substrate is heated at a temperature of the substrate of 180° C. to 250° C. and a temperature in the gas reservoir is set to the temperature of the substrate or less.

4. The method of manufacturing a semiconductor device according to claim 3, wherein in the supply of the ozone gas, the substrate is heated at the temperature of the substrate of 180° C. to 250° C., a temperature of an ozone gas supply path is set to the temperature of the substrate or less, and the temperature in the gas reservoir is set to the temperature of the ozone supply path or less.

5. The method of manufacturing a semiconductor device according to claim 1, wherein an inside of the gas reservoir is cooled.

6. The method of manufacturing a semiconductor device according to claim 1, wherein an inner wall of the gas reservoir is coated with a film.

7. The method of manufacturing a semiconductor device according to claim 6, wherein the film is an oxide film.

8. A method of manufacturing a semiconductor device, comprising:

forming an oxide film on a surface of a substrate by setting (a)-(c) as one cycle and repeating the cycle multiple times:

(a) reserving an ozone gas into a gas reservoir connected to the processing chamber, with a volume ratio of 1/2100 to 1/105 to the processing chamber, by supplying the ozone into the gas reservoir;

(b) flush-supplying the ozone gas reserved in the gas reservoir into the processing chamber in a state of substantially stopping exhaust of an atmosphere in the processing chamber while maintaining the supply of the ozone gas into the gas reservoir, after a prescribed amount of the ozone gas is reserved in the gas reservoir and so that the pressure in the processing chamber immediately after supplying the ozone gas is set to be within a range of 0.1 to 1000 Pa; and (c) exhausting an atmosphere in the processing chamber.

9. The method of manufacturing a semiconductor device according to claim 8, wherein in the supply of the ozone gas, the substrate is heated at a temperature of the substrate of 180° C. to 250° C. and a temperature in the gas reservoir is set to the temperature of the substrate or less.

10. The method of manufacturing a semiconductor device according to claim 9, wherein in the supply of the ozone gas, the substrate is heated at the temperature of the substrate of 180° C. to 250° C., a temperature of an ozone gas supply path is set to the temperature of the substrate or less, and the temperature in the gas reservoir is set to the temperature of the ozone gas supply path or less.

11. The method of manufacturing a semiconductor device according to claim 8, wherein an inside of the gas reservoir is cooled.

12. The method of manufacturing a semiconductor device according to claim 8, wherein an inner wall of the gas reservoir is coated with a film.

13. The method of manufacturing a semiconductor device according to claim 12, wherein the film is an oxide film.

14. A method of manufacturing a semiconductor device, comprising:

setting (a)-(d) as one cycle and repeating the cycle several times:

(a) supplying a source gas into a processing chamber, by opening a first valve provided in a source gas supply path for supplying the source gas into the processing chamber in which a substrate is accommodated;

(b) reserving an ozone gas in a gas reservoir with a volume ratio of 1/2100 to 1/105 to the processing chamber, provided in an ozone gas supply path for supplying the ozone gas into the processing chamber by opening a third valve provided at an upstream side of the gas reservoir in the ozone gas supply path with a second valve provided at a downstream side of the gas reservoir in the ozone gas supply path closed and with a fourth valve provided in an exhaust path for exhausting the atmosphere in the processing chamber opened;

(c) flush-supplying the ozone gas reserved in the gas reservoir into the processing chamber by opening the second valve with the third valve opened and the fourth valve closed; and (d) exhausting an atmosphere in the processing chamber.

15. The method of manufacturing a semiconductor device according to claim 14, wherein in the supply of the ozone gas, the substrate is heated at a temperature of the substrate of 180° C. to 250° C. and a temperature in the gas reservoir is set to the temperature of the substrate or less.

16. The method of manufacturing a semiconductor device according to claim 15, wherein in the supply of the ozone gas, the substrate is heated at the temperature of the substrate of 180° C. to 250° C., a temperature of an ozone gas supply path is set to the temperature of the substrate or less, and the temperature in the gas reservoir is set to the temperature of the ozone supply path or less.

17. The method of manufacturing a semiconductor device according to claim 14, wherein an inside of the gas reservoir is cooled.

18. The method of manufacturing a semiconductor device according to claim 14, wherein an inner wall of the gas reservoir is coated with a film.

19. The method of manufacturing a semiconductor device according to claim 18, wherein the film is an oxide film.

* * * * *